(12) United States Patent
Liao et al.

(10) Patent No.: US 8,659,239 B2
(45) Date of Patent: Feb. 25, 2014

(54) CIRCUIT AND METHOD FOR PROVIDING ABSOLUTE INFORMATION FOR FLOATING GROUNDED INTEGRATED CIRCUIT

(75) Inventors: Chia-Wei Liao, Taipei (TW); Roland Van Roy, Eindhoven (NL); Jing-Meng Liu, Zhubei (TW); Leng-Nien Hsiu, Zhubei (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 436 days.

(21) Appl. No.: 13/189,968

(22) Filed: Jul. 25, 2011

(65) Prior Publication Data

US 2012/0187997 A1 Jul. 26, 2012

Related U.S. Application Data

(60) Provisional application No. 61/368,751, filed on Jul. 29, 2010.

(51) Int. Cl.
*H05B 37/02* (2006.01)

(52) U.S. Cl.
USPC ........... 315/307; 315/291; 315/294; 315/224; 315/247; 327/108; 327/100

(58) Field of Classification Search
CPC .......... H05B 33/0815; H05B 33/0833; H05B 33/0839; H05B 33/0842; H05B 33/0854; H05B 41/3921; H05B 41/3925; H05B 41/3927
USPC .............. 315/169.1, 224, 225, 247, 291, 294, 315/297, 307, 312, 185 R; 327/53, 56, 100, 327/108
See application file for complete search history.

(56) References Cited

U.S. PATENT DOCUMENTS

| | | | |
|---|---|---|---|
| 6,218,788 B1 * | 4/2001 | Chen et al. | 315/225 |
| 6,339,298 B1 * | 1/2002 | Chen | 315/224 |
| 7,279,753 B1 * | 10/2007 | O et al. | 257/355 |
| 8,098,021 B2 * | 1/2012 | Wang et al. | 315/291 |
| 8,558,462 B2 * | 10/2013 | Chen | 315/122 |

* cited by examiner

*Primary Examiner* — Haiss Philogene
(74) *Attorney, Agent, or Firm* — Tung & Associates

(57) ABSTRACT

The present invention discloses a circuit and a method for providing absolute information for floating grounded integrated circuit. The method includes: receiving an absolute information sense signal carrying absolute information; converting the absolute information sense signal to a current signal; and generating an internal reference signal according to the current signal, wherein the internal reference signal or a relationship between the internal reference signal and a floating ground level is related to the absolute information.

29 Claims, 19 Drawing Sheets

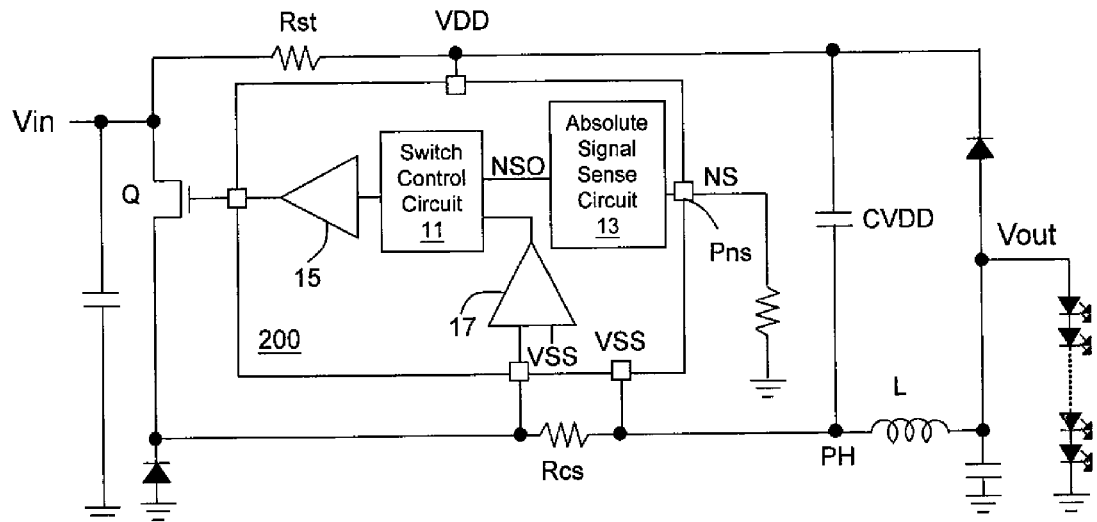
Fig. 3
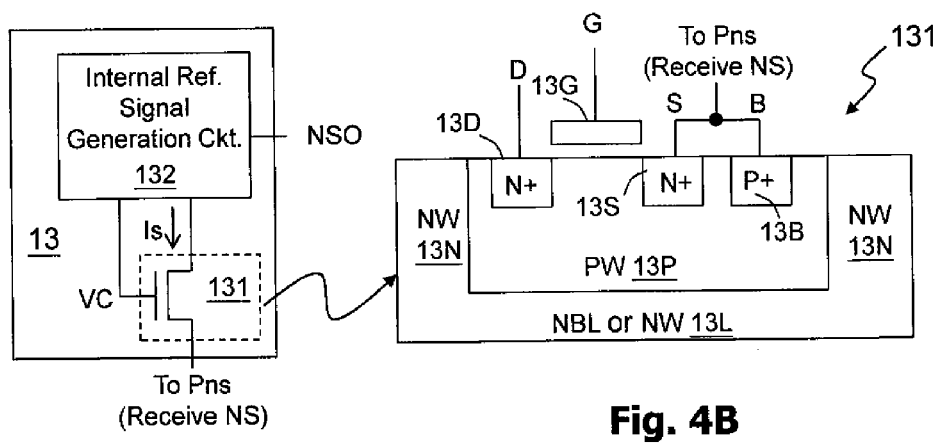
Fig. 4A
Fig. 4B

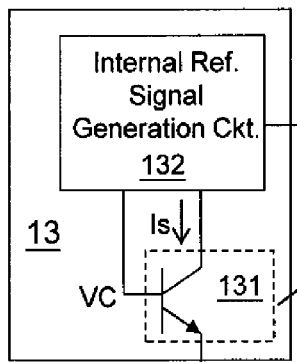
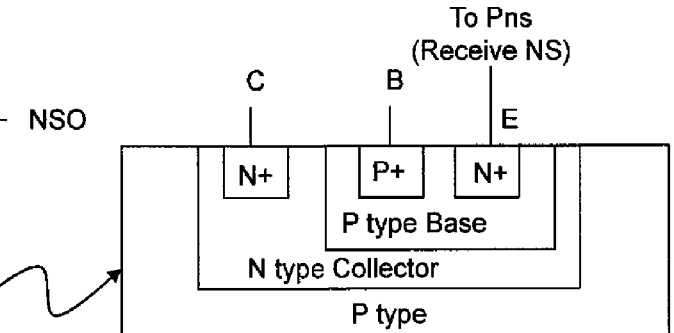
Fig. 4C   Fig. 4D
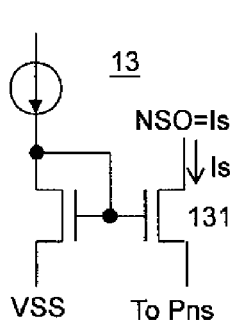 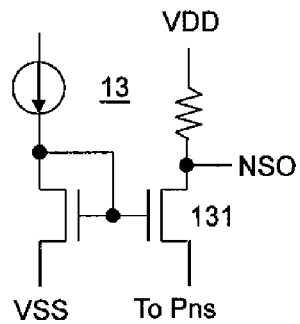 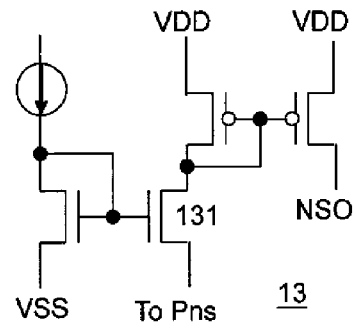
Fig. 5A   Fig. 5B   Fig. 5C
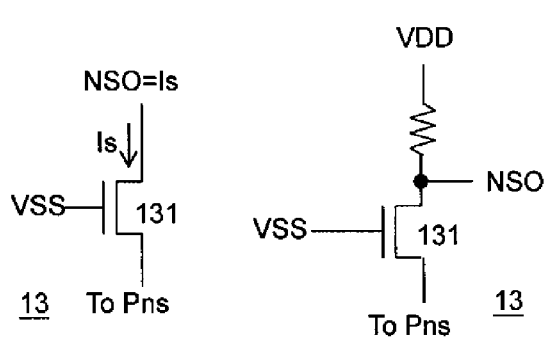 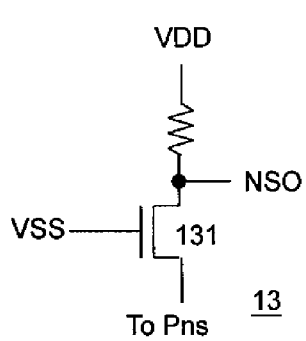 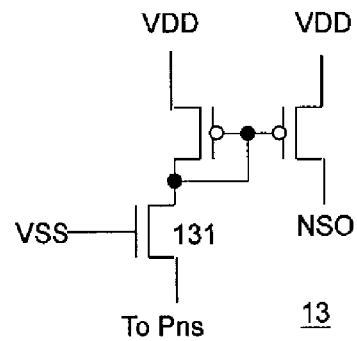
Fig. 5D   Fig. 5E   Fig. 5F

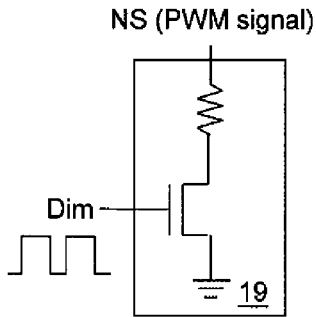
Fig. 8A
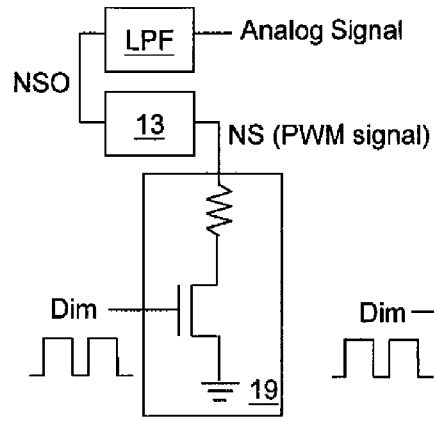
Fig. 8B
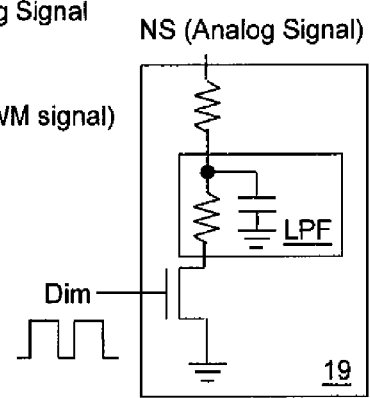
Fig. 8C
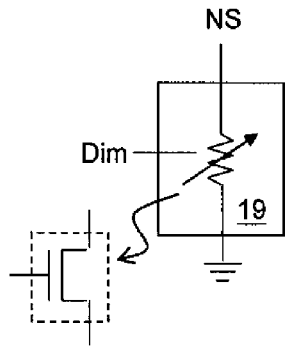
Fig. 8D
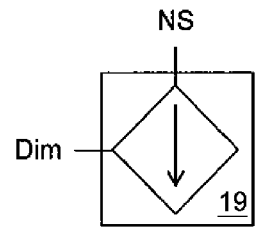
Fig. 8E
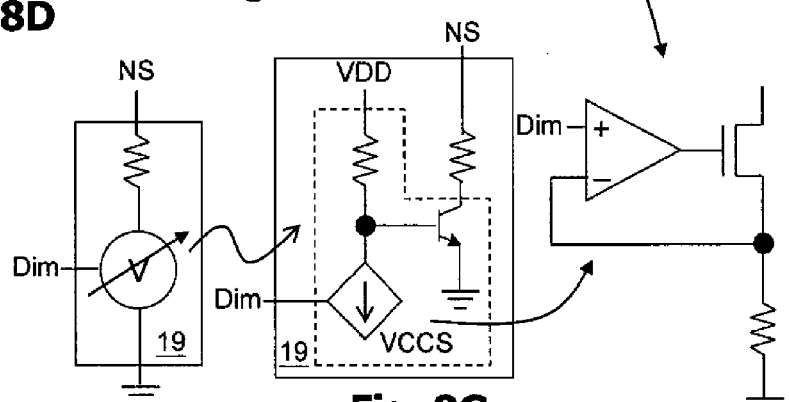
Fig. 8F  Fig. 8G  Fig. 8H

Fig. 9A  Fig. 9B

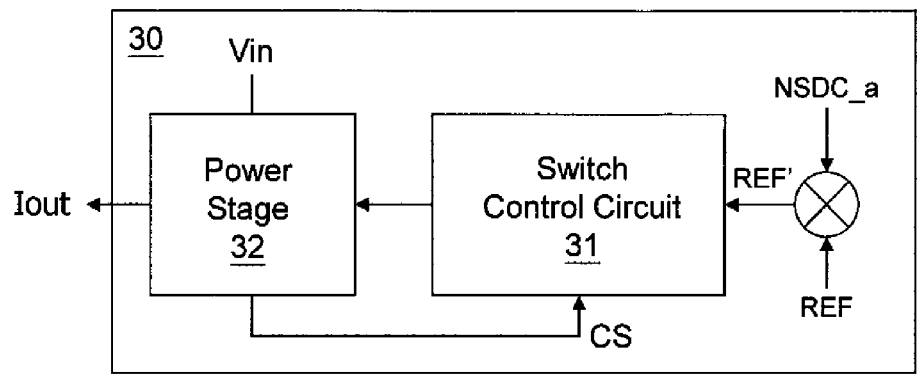
Fig. 13A
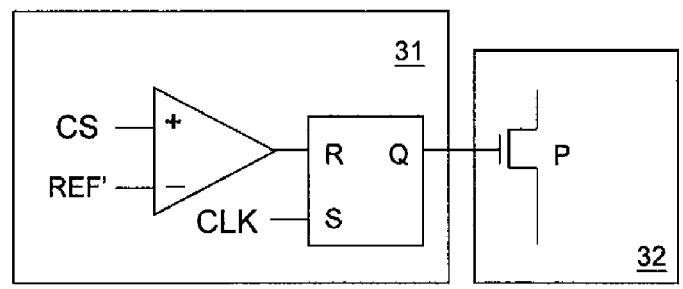
Fig. 13B
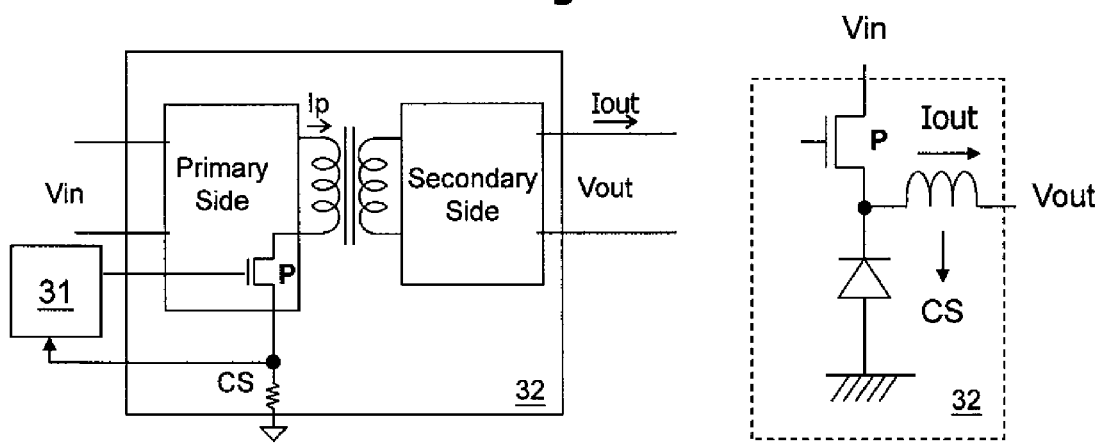
Fig. 13C  Fig. 13D

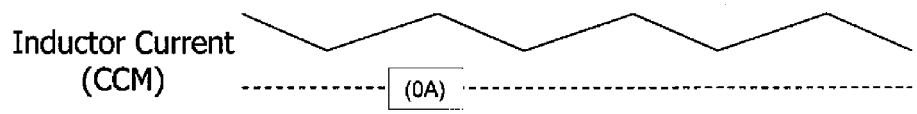
Fig. 15A
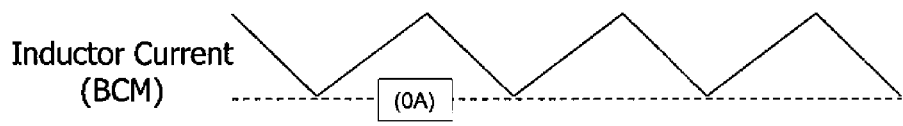
Fig. 15B
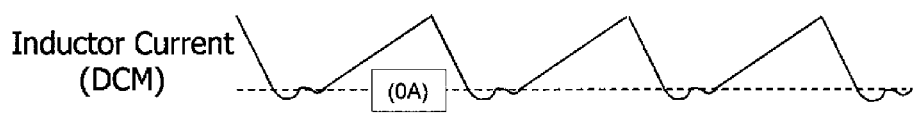
Fig. 15C
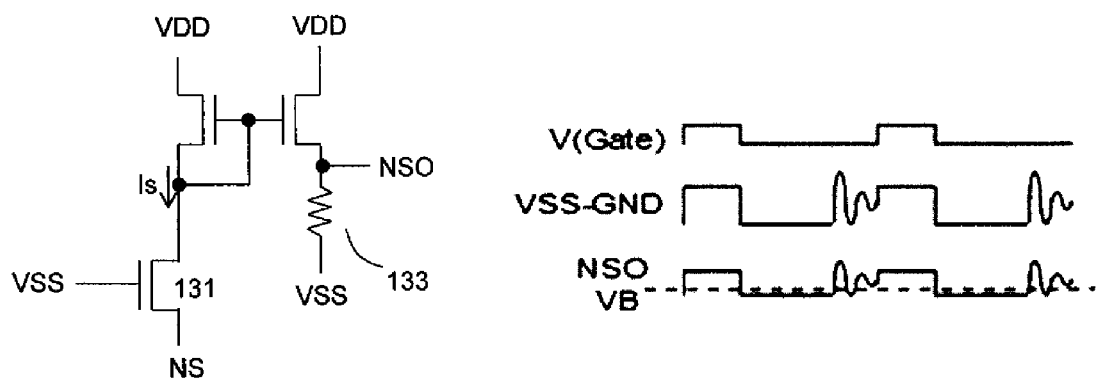
Fig. 16A             Fig. 16B

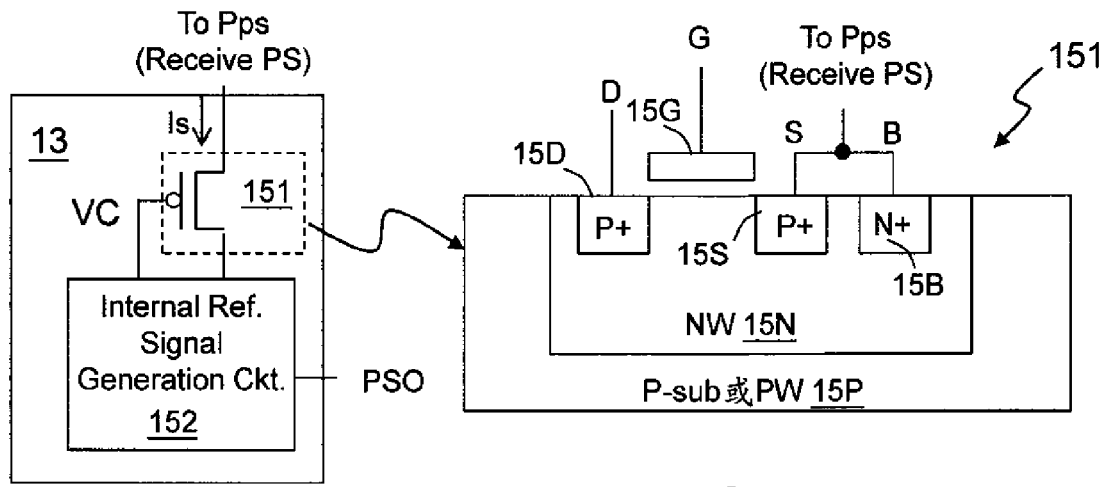
Fig. 20A
Fig. 20B
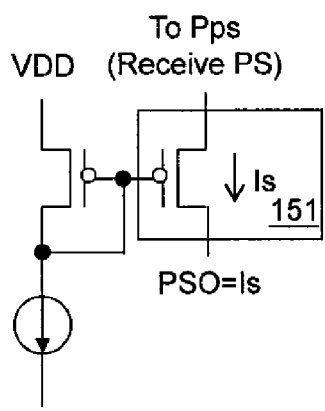
Fig. 20C
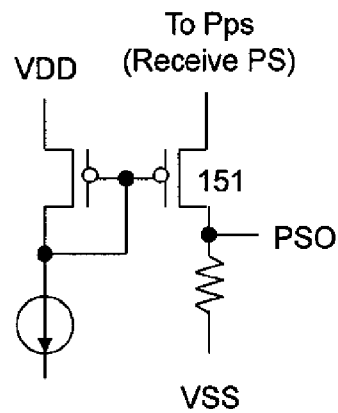
Fig. 20D
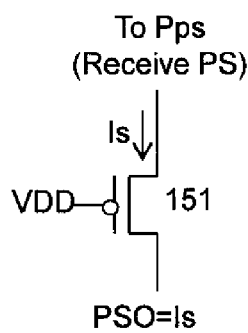
Fig. 20E
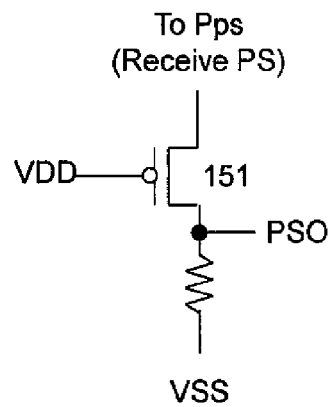
Fig. 20F

CIRCUIT AND METHOD FOR PROVIDING ABSOLUTE INFORMATION FOR FLOATING GROUNDED INTEGRATED CIRCUIT

CROSS REFERENCE

The present invention claims priority to U.S. provisional application No. 61/368,751, filed on Jul. 29, 2010.

BACKGROUND OF THE INVENTION

1. Field of Invention

The present invention relates to a circuit and a method for providing absolute information for a floating grounded integrated circuit (IC).

2. Description of Related Art

For an IC to operate, it requires a high operation level (often expressed as VDD) and a ground level (often expressed as VSS or GND). In a normal case, the ground level is 0V, a fixed level, such as in the prior art shown in FIG. 1, the ground pin GND is connected to ground (0V). However in certain case, in order to reduce the voltage difference between the high operation level and the ground level such that internal devices of the IC do not require a high specification, a floating grounded IC is proposed. Referring to FIG. 2 which shows an LED (light emitting diode) driver circuit, wherein a power transistor Q, a diode DF and an inductor L forms a buck power conversion circuit; the IC 100 controls the operation of the power transistor Q to convert an input voltage Vin across an input capacitor Cin to an output voltage Vout stored in an output capacitor Cout, and the output voltage Vout is provided to LEDs. A sense resistor Rcs generates a current sense signal which is fed back to the IC for controlling the current through the LEDs. In this prior art, the ground pin VSS is connected to a node PH. When the power transistor Q is turned ON, the voltage at the node PH is equal to the input voltage Vin minus a voltage drop caused by the on-resistance of the power transistor Q and the sense resistor Rcs, and when the power transistor Q is turned ON, the voltage at the node PH is equal to 0V minus the voltage drop caused by the diode DF, so the voltage at the node PH is not at a fixed level, and therefore the ground level VSS of the IC is floating. In the following context of this specification, in order for the terms to express clear meanings, the reference GND is used for indicating an absolute ground level, while the reference VSS is used for indicating a floating ground level (even though VSS is often used for indicating an absolute ground level in the technical field of this invention, this term VSS will be used dedicatedly for indicating a floating ground level in the following context of this specification).

Although the prior art shown in FIG. 2 can reduce the voltage difference between the high operation level and the ground level, it has a problem that the IC is applied to a system which controls the IC by, or transmits to the IC, signals operating with reference to the absolute ground. (In the following context of this specification, such signals which operate with reference to the absolute ground will be referred to as "absolute signals". Such absolute signals for example may be an analog or digital control signal or a series of control signals, or one or more voltage levels.) The prior art floating grounded IC can not handle these control signal (s) or voltage level (s).

In view of the above, the present invention a circuit and a method for providing absolute information for a floating grounded IC to solve the problem in the prior art, such that a floating grounded IC can recognize information carried by an absolute signal such as control information or a voltage level (referred to hereinafter as "absolute information"), but does not require a complicated circuit or processing steps.

SUMMARY OF THE INVENTION

The objective of the present invention is to provide a circuit and a method for providing absolute information for a floating grounded IC.

To achieve the above and other objectives, in one aspect, the present invention discloses a method for providing absolute information for a floating grounded IC, the IC operating between a high operation level and a floating ground level, the method comprising: receiving an absolute information sense signal carrying absolute information; converting the absolute information sense signal to a current signal; and generating an internal reference signal according to the current signal converted from the absolute information sense signal, wherein the internal reference signal or a relationship between the internal reference signal and the floating ground level is related to the absolute information.

In another aspect, the present invention discloses a circuit for providing absolute information for a floating grounded IC, the IC operating between a high operation level and a floating ground level, the circuit for providing absolute information comprising: a transistor having a current inflow end, a current outflow end and a control end, one of the current inflow end and the current outflow end receiving an absolute information sense signal carrying absolute information related to an absolute level, the control end receiving a control voltage, so as to generate a current signal at the current inflow end; and an internal reference signal generation circuit providing the control voltage to control the transistor, and generating an internal reference signal according to the current signal, wherein the internal reference signal or a relationship between the internal reference signal and the floating ground level is related to the absolute information.

The internal reference signal can be used for providing at least one of the following functions: dimming control; reproducing a waveform of an input voltage with reference to an absolute ground level; tri-electrode alternating current (TRIAC) dimming; determining timing to fire TRIAC; adjusting a dimming ratio of TRIAC dimming; under voltage lock out; differentiating high line or low line input; power factor correction; boundary conduction control; and dimming control by an alternating current (AC) power switch.

In one embodiment, the internal reference signal is in current form and has a value equal to or proportional to the current signal.

In another embodiment, the internal reference signal generation circuit converts the current signal to a voltage proportional to the current signal and adds the voltage to the floating ground level to generate the internal reference signal.

In one embodiment, the control voltage controlling the transistor is the high operation level or the floating ground level.

In one embodiment, the transistor is formed in a substrate and it includes: a body of a first conductivity type, located below a surface of the substrate; a gate located above the substrate, for receiving a gate voltage; a source and a drain of a second conductivity type, located in the body and at two sides of the gate; a body electrode of a first conductivity type, located in the body and coupled to the source, for receiving the absolute information sense signal together with the source.

In another embodiment, the transistor is formed in a substrate and it includes: an isolated collector region of a first conductivity type, located below a surface of the substrate; a collector electrode of a first conductivity type, located in the isolated collector region; a base region of a second conductivity type, located in the isolated collector region; a base electrode of a second conductivity type, located in the base region; and an emitter electrode of a first conductivity type, located in the base region.

In yet another embodiment, the transistor is formed in a substrate and it includes: an isolated base region of a first conductivity type, located below a surface of the substrate; a base electrode of a first conductivity type, located in the base region; a collector electrode of a second conductivity type, located in the base region; and an emitter electrode of a second conductivity type, located in the base region. Preferably, the transistor further comprises a high concentration doped region of a first conductivity type below the base region.

In one embodiment, the absolute information sense signal is generated by a dimming circuit according to a dimming signal.

In one embodiment, the circuit for providing absolute information for a floating grounded IC preferably further comprises a low pass filter or a peak detector coupled to the internal reference signal generation circuit, to generate a direct current (DC) signal according to the internal reference signal.

The objectives, technical details, features, and effects of the present invention will be better understood with regard to the detailed description of the embodiments below.

BRIEF DESCRIPTION OF THE DRAWINGS

FIG. 3 shows a first embodiment of the present invention.

FIG. 4A shows an embodiment of the absolute signal sense circuit 13 according to the present invention.

FIG. 4B shows an embodiment of the transistor 131 in FIG. 4A.

FIG. 4C shows another embodiment of the absolute signal sense circuit 13 according to the present invention.

FIG. 4D shows an embodiment of the transistor 131 in FIG. 4C.

FIGS. 5A-5L show several other embodiments of the absolute signal sense circuit 13.

FIGS. 8A-8C show several embodiments of the dimming circuit 19 when the dimming signal Dim is a pulse width modulation (PWM) signal.

FIGS. 8D-8G show several embodiments of the dimming circuit 19 when the dimming signal Dim is an analog signal.

FIG. 8H shows an example of a voltage controlled current source.

FIGS. 9A-9C illustrate that the present invention can reproduce a waveform of an input voltage with reference to the absolute ground level, and obtain a substantially similar waveform NSDC_a or a DC level NSDC_b, to be used for functions which require such information.

FIGS. 13A-13D illustrate an example as to how the present invention is applied to power factor correction.

FIGS. 15A-15C show that the power conversion circuit is operating in continuous conduction mode (CCM), boundary conduction mode (BCM) and discontinuous conduction mode (DCM), respectively.

FIGS. 16A-16F illustrate an example as to how the present invention is applied to detecting DCM and operating the power conversion circuit towards BCM.

FIG. 20A shows another embodiment of the absolute signal sense circuit 13 according to the present invention.

FIG. 20B shows an embodiment of the transistor 151 in FIG. 20A.

FIG. 20C-20F show several other embodiments of the absolute signal sense circuit 13 according to the present invention.

DESCRIPTION OF THE PREFERRED EMBODIMENTS

Figure 1:
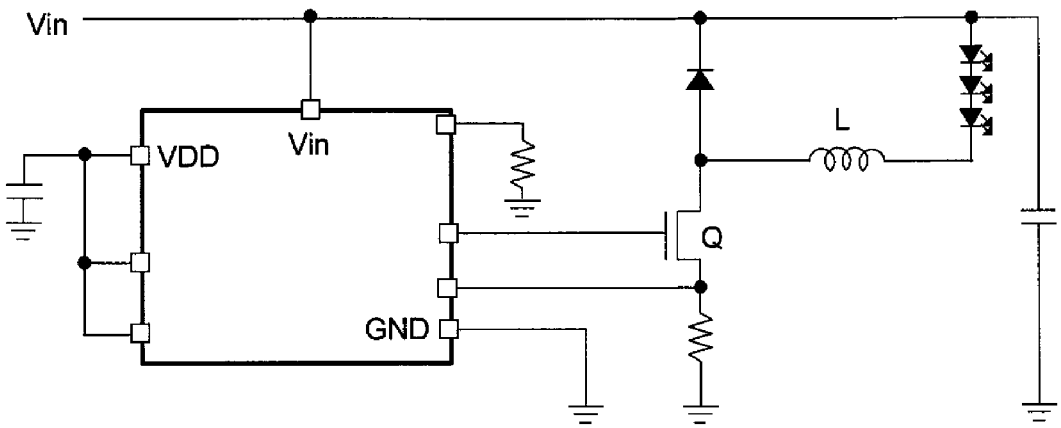
FIG. 1 shows a schematic diagram of a prior art IC having a ground pin GND connected to an absolute ground level (0V).

For better comparison with the prior art, the present invention will be explained using an LED driver circuit as an example, but it should be understood that the spirit of the present invention can be applied to any IC operating with reference to a floating ground level, not limited to an LED driver circuit.

Referring to FIG. 3, the IC 200 is an LED driver circuit for example, which includes a switch control circuit 11, a driver gate 15, and an error amplifier 17. The error amplifier 17 generates an error amplified signal according to a voltage across a sense resistor Rcs, and inputs the error amplified signal to the switch control circuit 11. The switch control circuit 11 generates a power transistor control signal according to the error amplified signal, which is outputted through the driver gate 15 to control a power transistor Q. The power transistor Q operates to convert an input voltage Vin to an output voltage Vout, such that the LED devices are supplied with a necessary current.

The objective of the present invention is to provide absolute information to a floating grounded IC. In general, the input voltage Vin with reference to the absolute ground level is a useful absolute signal. In the shown embodiment, the ground pin VSS of the IC 200 is connected to the node PH, so the IC 200 operates with reference to a floating ground level. When the power transistor Q is on, the floating ground level VSS is about equal to the input voltage Vin (the voltage drop caused by the on-resistance of the power transistor Q and the sense resistor Rcs can be ignored); when the power transistor Q is off, the floating ground level VSS is about equal to 0V (the voltage drop caused by the diode at the lower left can be ignored). Because the floating ground level VSS switches between about the input voltage Vin and about the absolute ground level, the absolute information carried by the input voltage Vin (an absolute signal with reference to the absolute ground level) can be extracted according to the voltage difference between the floating ground level VSS and the absolute ground level, or according to the voltage difference between the floating ground level VSS and the input voltage Vin. In addition, because during operation, there is a fixed voltage difference between the high operation level VDD of the IC and the floating ground level VSS (such voltage difference may be different values indifferent applications), the absolute information carried by the input voltage Vin (an absolute signal with reference to the absolute ground level) also can be extracted according to the voltage difference between the high operation level VDD and the input voltage Vin, or according to the voltage difference between the high operation level VDD and the absolute ground level. However, please note that the present invention can extract information from other absolute signals, not limited to the input voltage Vin. The absolute signal can be a voltage level or a control signal in any form (such as a PWM signal, which will be explained by examples later).

In order to obtain the absolute information, a feature of the present invention is that the IC further includes an absolute signal sense circuit 13. In the embodiment of FIG. 3, the absolute signal sense circuit 13 obtains a sense signal NS carrying absolute information from outside the IC 200 through an absolute signal sense pin Pns, and converts the sense signal NS to an internal reference signal NSO inside the IC 200. The absolute information sense signal NS carries absolute information, i.e., information with reference to an absolute level; in this embodiment, the absolute level is the absolute ground level 0V, and the absolute information sense signal NS is a current signal proportional to a voltage difference between the floating ground level and the absolute ground level. As stated above, the voltage difference between the floating ground level and the absolute ground level carries absolute information of the input voltage Vin with reference to the absolute ground level. Details of the above will be more clearly understood from the embodiments of the absolute signal sense circuit 13. The internal reference signal NSO is a reference signal with reference to the floating ground level VSS (the voltage level at the node PH). The internal reference signal NSO corresponds to the absolute information sense signal NS (the two signals can be equal in value, in proportion, or one being a function of the other). That is, the internal reference signal NSO or a relationship between the internal reference signal NSO and the floating ground level VSS, carries information of the absolute information sense signal NS, or equally speaking, the absolute information carried by the absolute information sense signal NS, is converted to the internal reference signal NSO or a relationship between the internal reference signal NSO and the floating ground level VSS. The internal reference signal NSO can be a current signal or a voltage signal. The IC 200 can perform many functions according to this internal reference signal NSO, such as adjusting the brightness of the LEDs (dimming), controlling the power conversion to be in boundary conduction mode, etc. (applications will be described later). It is shown in the figure that the absolute signal sense pin Pns is connected to an external resistor, but this does not mean that the absolute signal sense pin Pns must be connected with a resistor. It only intends to mean that the absolute signal sense pin Pns obtains the absolute information sense signal NS from outside the IC 200. The absolute information sense signal NS can be provided by any means depending on circuit designs and applications. The absolute information sense signal NS can be a current signal or a voltage signal.

Several examples of the absolute signal sense circuit 13 will be described below. Referring to FIG. 4A, the absolute signal sense circuit 13 includes a transistor 131 and an internal reference signal generation circuit 132. The transistor 131 is shown to be a MOSFET (metal-oxide semiconductor field effect transistor) as an example; however, the transistor 131 can be another type of FET such as a MESFET (metal-semiconductor field effect transistor) or a JFET (junction field effect transistor), or a BJT (bipolar junction transistor). The control end of the transistor 131 (the gate of a FET, or the base of a BJT) receives a control voltage VC, so that the transistor 131 generates a current Is at its current inflow end or current outflow end (the source or drain of a FET, or the collector or emitter of a BJT). The current Is corresponds to the absolute information sense signal NS; it is a current proportional to a voltage difference between the floating ground level and the absolute ground level. It should be explained here that it is conceptually the same either the current Is is generated at the current inflow end or the current outflow end. For a FET, the current at the current outflow end is equal to the current at the current inflow end; for a BJT, although there is a difference between the current at the current outflow end and the current at the current inflow end, which difference is the base current, generally such base current can be ignored and the current at the current outflow end and the current at the current inflow end can be deemed as about the same. The internal reference signal generation circuit 132 provides the control voltage VC to control the transistor 131, and converts the current Is to the internal reference signal NSO. The internal reference signal NSO can be a current signal having a value equal to the current Is, or a voltage or current signal converted from the current Is. After the current Is is converted to the internal reference signal NSO, the IC 200 can safely uses this internal reference signal NSO without concerns such as that the current signal might generate a high voltage to affect or damage a circuit device.

One preferred embodiment of the transistor 131 is shown in FIG. 4B. As shown in the figure, the transistor 131 is for example an NMOS transistor, which comprises: a P type body 13P formed by a P-well, the P-well being encompassed by an N-well 13N in horizontal direction and an N type buried layer or deep well 13L below; an N type heavily doped drain 13D and an N type heavily doped source 13S formed in the P type body 13P; a P type heavily doped body electrode 13B formed in the P type body 13P; and a gate 13G above the substrate. The N type buried layer or deep well 13L for example can be connected to a high voltage VNBL, and in this case the gate voltage VC of the transistor 131 is preferably smaller than this high voltage VNBL plus the threshold voltage Vt of the transistor 131 plus the PN junction forward bias voltage Vf between the P type body 13P and the N type buried layer or deep well 13L, that is, preferably, VC<VNBL+Vt+Vf.

There are various ways for the internal reference signal generation circuit 132 to convert the current Is to the internal reference signal NSO such that the internal reference signal NSO or a relationship between the internal reference signal NSO and the floating ground level VSS is related to the absolute information carried by the absolute information sense signal NS. Several examples of the internal reference signal generation circuit 132 are shown in FIGS. 5A-5F.

In FIG. 5A, the current from the current source at the left generates the control voltage VC with reference to the floating ground level VSS through the drain and gate of the left transistor. Thus, the current Is is generated in the transistor 131 at the right because of the control voltage VC. If the characteristics of the transistor 131 is properly designed, for example by controlling the sensitivity of the gate to source voltage Vgs to current such that the transistor has a low Vgs-to-current sensitivity, the source of the transistor 131 will be similar to a voltage follower following the voltage level of the floating ground level VSS, so that a corresponding relationship between the voltage level of the absolute signal sense pin Pns and the floating ground level VSS is established. By providing a device or circuit between the absolute signal sense pin Pns and an absolute signal (such as the absolute ground level GND), the device or circuit converting the voltage difference between the pin Pns and the absolute signal to a current, the current (which is the current Is) can be used to indicate the relationship between the voltage level of the absolute signal sense pin Pns and the absolute signal, and this also indicates the relationship between the floating ground level VSS and the absolute signal because the voltage level of the absolute signal sense pin Pns corresponds to the floating ground level VSS. The device or circuit between the absolute signal sense pin Pns and the absolute signal can be, for example but not limited to, a resistor. Because the floating ground level VSS switches between about the input voltage Vin and the absolute ground level, the relationship between the floating ground level VSS and the absolute signal includes information about the relationship between the input voltage Vin and the absolute signal, and information about the relationship between the absolute signal and the absolute ground level; such information can be extracted or used by proper means. In brief, the voltage difference between the absolute signal sense pin Pns and an absolute signal (such as the absolute ground level GND) can be converted to the current Is so that the current Is carries absolute information, and in this embodiment, the absolute information sense signal NS is the current Is. The internal reference signal generation circuit 132 converts the absolute information sense signal NS to the internal reference signal NSO having a value equal to the current Is, but is safely readable by a circuit inside the IC.

In FIG. 5B, the internal reference signal NSO is a voltage signal which is equal to the high operation level VDD minus a voltage across the resistor in the figure, and the voltage across the resistor is equal to the current Is multiplied by the resistance of the resistor. Because the relationship between the high operation level VDD and the floating ground level VSS is fixed, the relationship between the internal reference signal NSO and the floating ground level VSS is related to the absolute information carried by the absolute information sense signal NS; in other words, the absolute information carried by the absolute information sense signal NS is converted to the relationship between the internal reference signal NSO and the floating ground level VSS.

FIG. 5C is similar to FIG. 5A, in which the internal reference signal NSO is a current signal, which is the current flowing from the PMOS transistor at the right. Note that the current mirror at the right can have any current replication ratio as desired, that is, the internal reference signal NSO does not need to have a value exactly equal to the current Is, but can be proportional to the current Is (i.e., the internal reference signal NSO can be a multiple or fraction of the current Is in number).

In FIGS. 5D-5F, the control end of the transistor 131 (the gate of a FET or the base of a BJT) receives the floating ground level VSS. In FIG. 5D, the internal reference signal generation circuit 132 is only required to provide the floating ground level VSS to the gate of the transistor 131. In this embodiment, the current Is is related to the gate to source voltage Vgs of the transistor 131, or, if a resistive device is connected between the pin Pns and the absolute signal, the current Is is related to the voltage across the resistive device; thus, the current Is is related to the voltage difference between the floating ground level VSS and the absolute signal. In other words, the internal reference signal NSO itself (having a value equal to the current Is in this embodiment) carries the information of the absolute information sense signal NS, and this means that the absolute information carried by the absolute information sense signal NS is converted to the content of the internal reference signal NSO.

FIGS. 5E and 5F are similar to FIGS. 5B and 5C respectively, except that the control voltage of the transistor 131 is changed from Vgs+VSS to VSS. In these embodiments, the internal reference signal NSO itself or the relationship between the internal reference signal NSO and the floating ground level VSS is related to the absolute information carried by the absolute information sense signal NS, that is, the absolute information carried by the absolute information sense signal NS is converted to the content of the internal reference signal NSO or the relationship between the internal reference signal NSO and the floating ground level VSS.

The transistor 131 is not necessarily a MOSFET; it can be any other type of transistor, such as a JFET, etc. Another embodiment of the transistor 131 is shown in FIG. 4C, which is a BJT having a control end (base) receiving the control voltage VC, to generate the current Is at its current inflow end (collector), wherein the current Is is related to the absolute information sense signal NS. The BJT can be embodied for example as the semiconductor structure shown in FIG. 4D, wherein the transistor 131 is formed in a P type substrate or a P type well formed by any suitable process; the transistor 131 includes an N type collector region located below a surface of the substrate and isolated by a P type region; an N type collector electrode located in the N type collector region; a P type base region located in the N type collector region; a P type base electrode in the P type base region; and an N type emitter region in the P type base region.

Figure 5G:
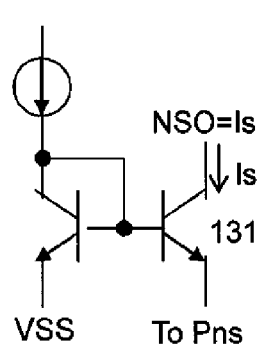
Figure 5H:
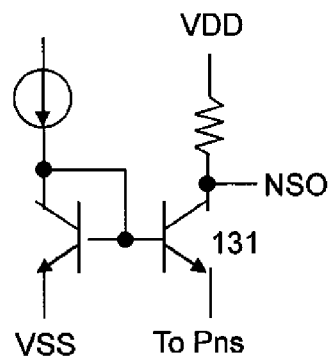
Figure 5I:
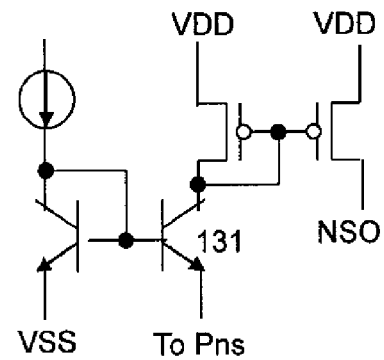
Figure 5J:
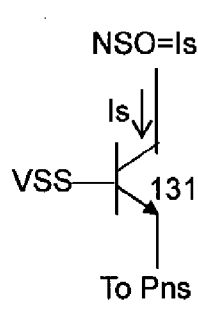
Figure 5K:
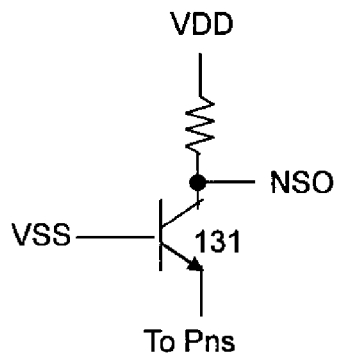
Figure 5L:
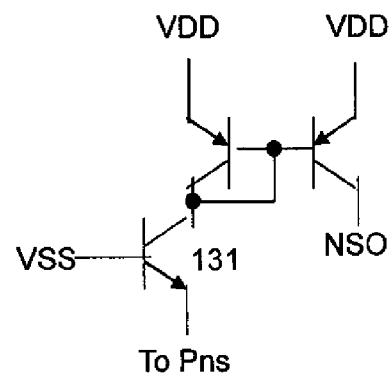

FIGS. 5G-5L show several examples illustrating how the internal reference signal generation circuit 132 cooperates with the BJT to convert the absolute information sense signal NS to the internal reference signal NSO. These circuits function in a similar way to FIGS. 5A-5F, and therefore detail explanation thereof is omitted. FIGS. 5I and 5L shows that the current mirror circuit in the figure can be formed by FETs or BJTs as equivalents. Similarly, the current mirror circuit in FIGS. 5C and 5F can be formed by BJTs instead.

Figure 6:
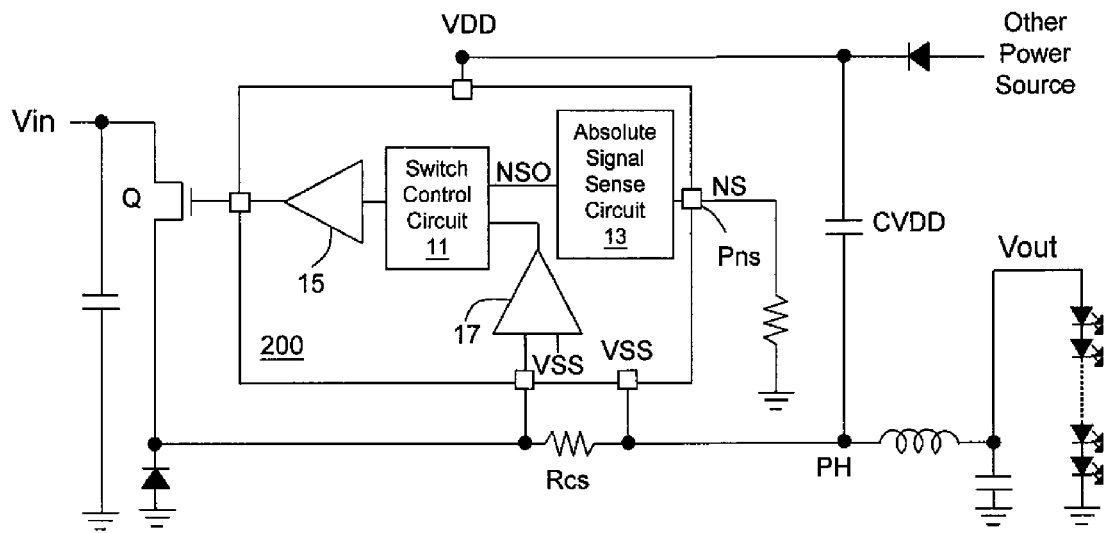
FIG. 6 shows another embodiment of the present invention.

In FIG. 3, the power (high operation level) VDD of the IC 200 is provided by the voltage across the capacitor CVDD, but when the circuit is starting up, there are not enough charges accumulated in the capacitor CVDD. To solve this, a start-up resistor Rst can be provided between the input voltage Vin and the high operation level VDD, to provide a start-up voltage to the IC 200. However, this is not the only way to provide the start-up voltage; as shown in FIG. 6, the start-up voltage can be provided by other means, not necessarily from the input voltage Vin through the resistor Rst.

Figure 2:
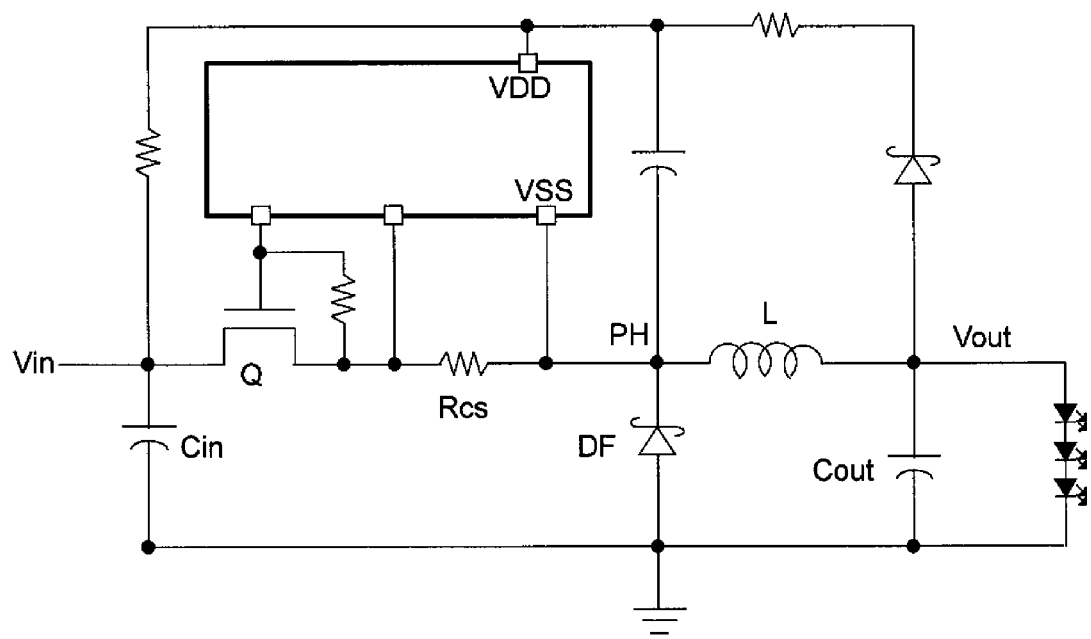
FIG. 2 shows another prior art IC having a ground VSS connected to a floating ground level.

In the prior art of FIG. 2, because the ground level is floating, it can not perform functions which require absolute information. In the present invention, because the IC can recognize the information expressed by an absolute signal (such as a control signal or a voltage level), the IC can perform functions which require absolute information. Several examples of such functions that the present invention can be applied to are explained below.

Application: Dimming Control

Figure 7:
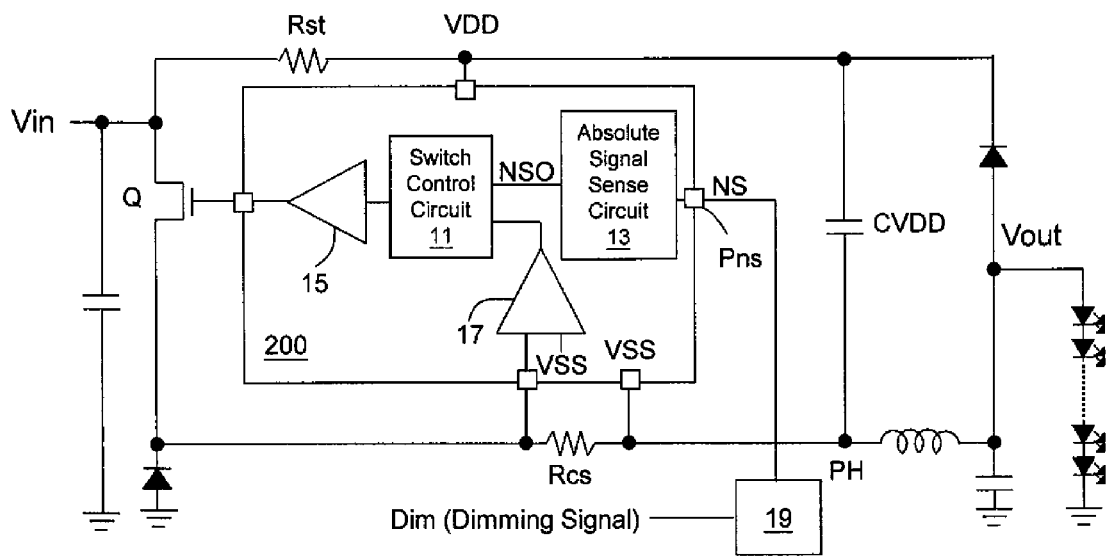
FIG. 7 shows an embodiment of the present invention which is applied to dimming control.

One function which requires absolute information is the dimming control to adjust the LED brightness. The dimming signal for controlling an LED driver circuit, either in PWM form or analog form, is an absolute signal with reference to the absolute ground level. Therefore, a floating grounded LED driver circuit must know the absolute information carried by such absolute signal so that it can perform dimming control. FIG. 7 shows an embodiment of the present invention which is applied to dimming control. The dimming circuit 19 receives a dimming signal Dim, and converts the dimming signal Dim to the absolute information sense signal NS which is inputted to the inside of the IC 200. The IC 200 can adjust the on-time or duty ratio of the power transistor Q according to the absolute information sense signal NS, so as to adjust the brightness of the LED devices.

More specifically, the dimming signal can be in PWM form or analog form (but in both cases it is an absolute signal with reference to the absolute ground level); FIGS. 8A-8C show several embodiments of the dimming circuit 19 when the dimming signal Dim is a PWM signal. In FIG. 8A, the dimming circuit 19 converts the PWM dimming signal Dim to the absolute information sense signal NS which is also in PWM form. In FIG. 8B, the absolute signal sense circuit 13 converts the absolute information sense signal NS in PWM form to the internal reference signal NSO which is also in PWM form. A low pass filter LPF converts the internal reference signal NSO to an analog signal. FIG. 8C shows that the low pass filter LPF can be integrated in the dimming circuit 19 such that the absolute information sense signal NS generated by the dimming circuit 19 is an analog signal.

FIGS. 8D-8G show several embodiments of the dimming circuit 19 when the dimming signal Dim is an analog signal. In FIG. 8D, the dimming circuit 19 is a voltage controlled resistor, which in one embodiment can be a transistor, and it converts the analog dimming signal Dim to the absolute information sense signal NS which is also in analog form. In FIG. 8E, the dimming circuit 19 is a voltage controlled current source, which in one embodiment can be a circuit as shown in FIG. 8H, and it also converts the analog dimming signal Dim to the absolute information sense signal NS in analog form. In FIG. 8F, the dimming circuit 19 includes a resistor and a voltage controlled voltage source, the latter in one embodiment being a circuit as shown by the dash line in FIG. 8G, and the dimming circuit 19 in this embodiment also converts the analog dimming signal Dim to the absolute information sense signal NS in analog form.

The absolute information sense signal NS generated by the dimming circuit 19 in FIGS. 8A-8F can be converted to the internal reference signal NSO by the absolute signal sense circuit 13, so that the floating grounded IC can uses the internal reference signal NSO for dimming control.

Application: Reproducing a Waveform of the Input Voltage with Reference to the Absolute Ground Level When the input voltage Vin is a signal obtained from an AC signal after bridge rectification, it will present a semi-sinusoidal waveform with reference to the absolute ground level GND, as shown by the first waveform in FIG. 9C. Many functions require to know such waveform of the input voltage Vin with reference to the absolute ground level GND, such as tri-electro AC (TRIAC) dimming, power factor correction (PFC), boundary conduction control, etc. To meet this requirement, the present invention proposes circuits and methods to reproduce the waveform of the input voltage Vin with reference to the absolute ground level GND in a floating grounded IC.

According to the present invention, the absolute signal sense circuit 13 for example can use any of the circuits shown in FIGS. 5D-5F, and a voltage device (such as a resistor) having a voltage proportional to the current Is can be provided between the internal reference signal NSO and the floating ground level VSS. Thus, the relationship between the internal reference signal NSO and the floating ground level VSS can reproduce the relationship between the input voltage Vin and the absolute ground level GND.

Figure 9C:
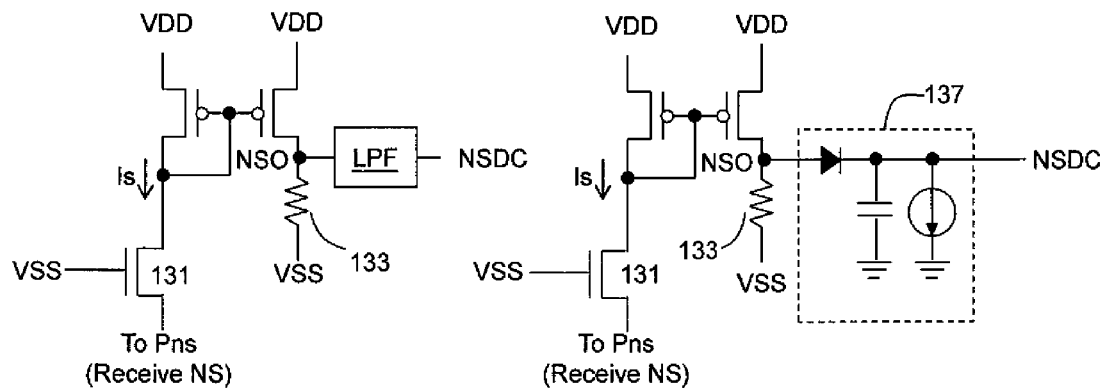
Figure 9C:
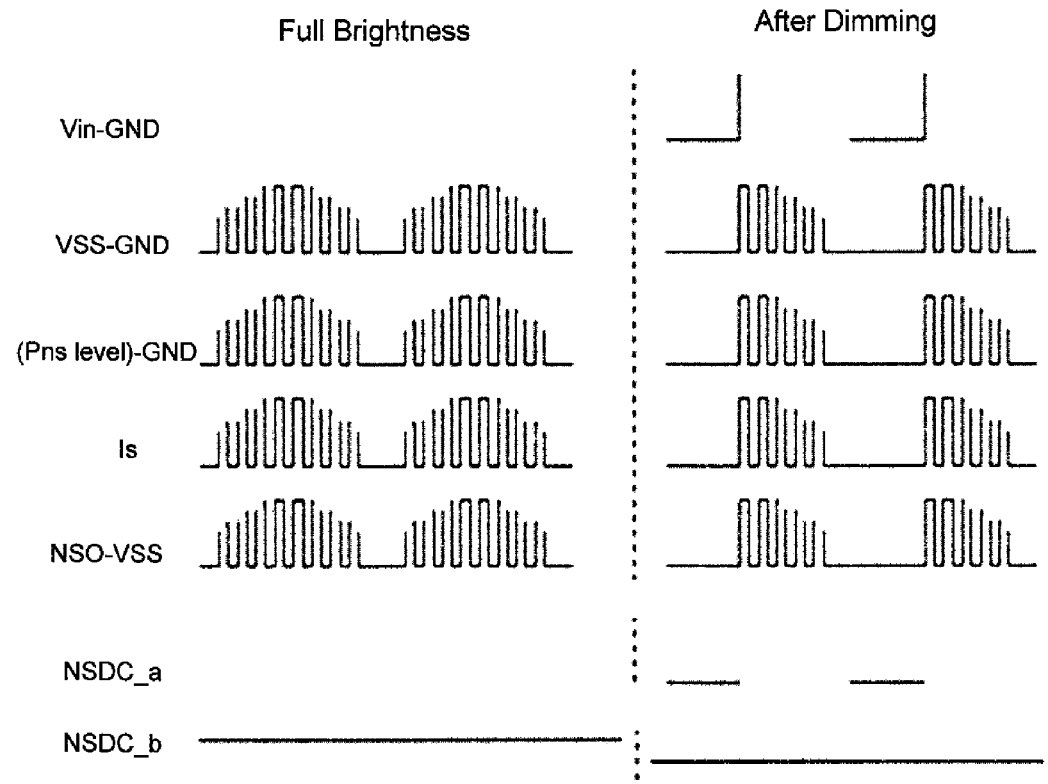

More specifically, referring to FIGS. 9A-9C, the absolute signal sense circuit 13 for example uses the circuit of FIG. 5F. When the power transistor Q is on, the floating ground level VSS is about equal to the input voltage Vin (referring to FIGS. 3, 6 and 7, the voltage drop caused by the on-resistance of the power transistor Q and the sense resistor Rcs can be ignored); when the power transistor Q is off, the floating ground level VSS is about equal to 0V (the voltage drop caused by the diode can be ignored). Hence, the floating ground level VSS (with reference to the absolute ground level GND) has a waveform as shown by the second waveform in FIG. 9C. When the power transistor Q is on, the transistor 131 is on, the voltage at the absolute signal sense pin Pns is equal to the floating ground level VSS minus the gate to source voltage difference of the transistor; when the power transistor Q is off, the voltage at the absolute signal sense pin Pns is about equal to the absolute ground level GND. Therefore, the voltage at the absolute signal sense pin Pns with reference to the absolute ground level GND has a waveform as shown by the third waveform in FIG. 9C. When the transistor 131 is on, it generates the current Is; when the transistor 131 is off, the current Is is zero. Therefore, the current Is has a waveform as shown by the fourth waveform in FIG. 9C. The internal reference signal NSO is equal to the floating ground level VSS plus the voltage across the resistor 133, and the voltage across the resistor 133 is equal to the current Is multiplied by the resistance of the resistor 133, so the internal reference signal NSO (with reference to the floating ground level VSS) has a waveform as shown by the fifth waveform in FIG. 9C, which reproduces the relationship between the input voltage Vin and the absolute ground level GND.

Application: Reproducing a Waveform of the Input Voltage with Reference to the Absolute Ground Level in TRIAC Dimming TRIAC dimming adjusts the turn-on angle of an AC signal; referring to the waveform at the upper right of FIG. 9C, in TRIAC dimming, a portion of the on-time is cut off. The fifth waveform at the right of FIG. 9C shows that the internal reference signal NSO can reproduce the waveform of the input voltage Vin after TRIAC dimming adjustment.

FIGS. 9A-9B show embodiments wherein the internal reference signal NSO passes through a low pass filter LPF (FIG. 9A) or a peak detector 137 (FIG. 9B) so that the internal reference signal NSO in ringing shape is converted to a direct current (DC) signal NSDC in analog form. Depending on the requirement to use the DC signal and the bandwidth design of the low pass filter LPF or the peak detector 137, the generated DC signal NSDC can substantially reproduce the waveform of the input voltage Vin with reference to the absolute ground level GND (as shown by the sixth waveform NSDC_a in FIG. 9C), or the generated DC signal NSDC can be a DC level (as shown by the seventh waveform NSDC_b in FIG. 9C, NSDC_b is an average value when the low pass filter LPF is used, or a peak value if the peak detector 137 is used).

Application: Determining Timing to Fire the TRIAC Dimming

In general, to perform TRIAC dimming function, there must be a minimum loading. Such minimum loading can be achieved by, for example: (1) increasing the current upper limit of a power conversion circuit; (2) switching the power conversion circuit to operate in a current mode having a constant peak (or valley) value, or in a hysteresis mode having a higher current level; (3) forcing the power transistor of the power conversion circuit to operate in a higher duty ratio; (4) switching the power conversion circuit to operate in a constant-on-time mode with a longer on time, or (5) other ways. The above actions to reach the minimum loading (i.e., to fire or initiate TRIAC dimming) should be taken at an earlier stage of the semi-sinusoidal waveform of the input voltage Vin, but not too early lest the voltage would be too low. In view of the above, the present invention discloses an embodiment for determining the timing to fire TRIAC dimming, which is explained with reference to FIGS. 10A-10C.

Figure 10A:
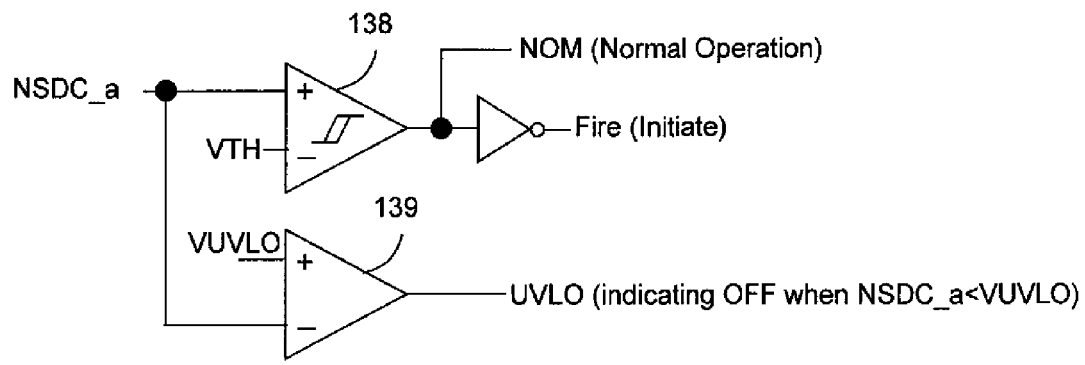
FIGS. 10A-10C illustrate an example as to how the present invention is applied to controlling a timing to fire TRIAC dimming.
Figure 10B:
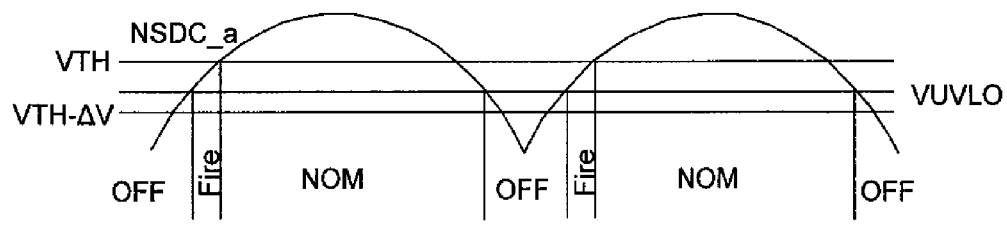
Figure 10C:
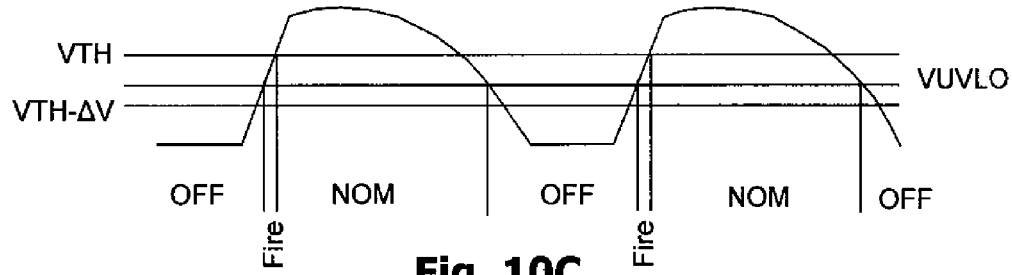

As shown in FIG. 10A, because the waveform NSDC_a reproduces the waveform of the input voltage Vin with reference to the absolute ground level GND, according to the present invention, the waveform NSDC_a can be inputted to a hysteresis comparator 138 and a comparator 139. The hysteresis comparator 138 compares the waveform NSDC_a with a reference level VTH, wherein the hysteresis zone of the hysteresis comparator 138 is $\Delta V$; the comparator 139 compares the waveform NSDC_a with an under voltage lock out reference level VUVLO. Referring to FIGS. 10A-10C, when the waveform NSDC_a has a level lower than the under voltage lock out reference level VUVLO, the comparator 139 generates a high level under voltage lock out signal UVLO, indicating that the voltage is too low, so the circuit should not fire TRIAC dimming (OFF). When the waveform NSDC_a has a level higher than the under voltage lock out reference level VUVLO, the comparator 139 generates a low level under voltage lock out signal UVLO; if the level of the waveform NSDC_a is lower than the reference level VTH, it means that the timing is at an earlier stage of the semi-sinusoidal waveform, so it is a good timing for the circuit to fire TRIAC dimming. However, if the level of the waveform NSDC_a is higher than the reference level VTH, it means that the semi-sinusoidal waveform of the input voltage Vin has passed its earlier stage, so the circuit should enter normal operation mode (NOM). When the waveform NSDC_a becomes lower than the reference level VTH, because it is not below the hysteresis zone $\Delta V$, the output of the hysteresis comparator 138 does not switch level; the circuit is still in the normal operation mode. When the waveform NSDC_a is again lower than the under voltage lock out reference level VUVLO, the circuit enters the OFF stage again.

Application: Adjusting the Dimming Ratio of TRIAC Dimming

Figure 11A:
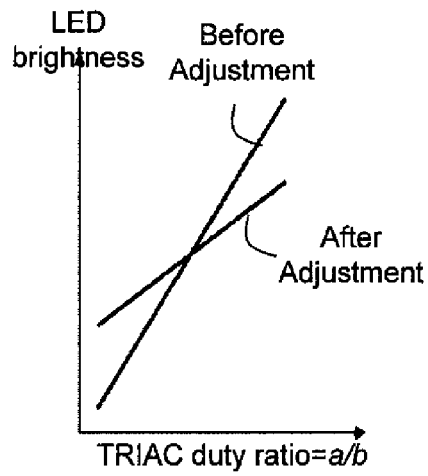
FIGS. 11A-11D illustrate an example as to how the present invention is applied to adjusting the ratio of TRIAC dimming.
Figure 11B:
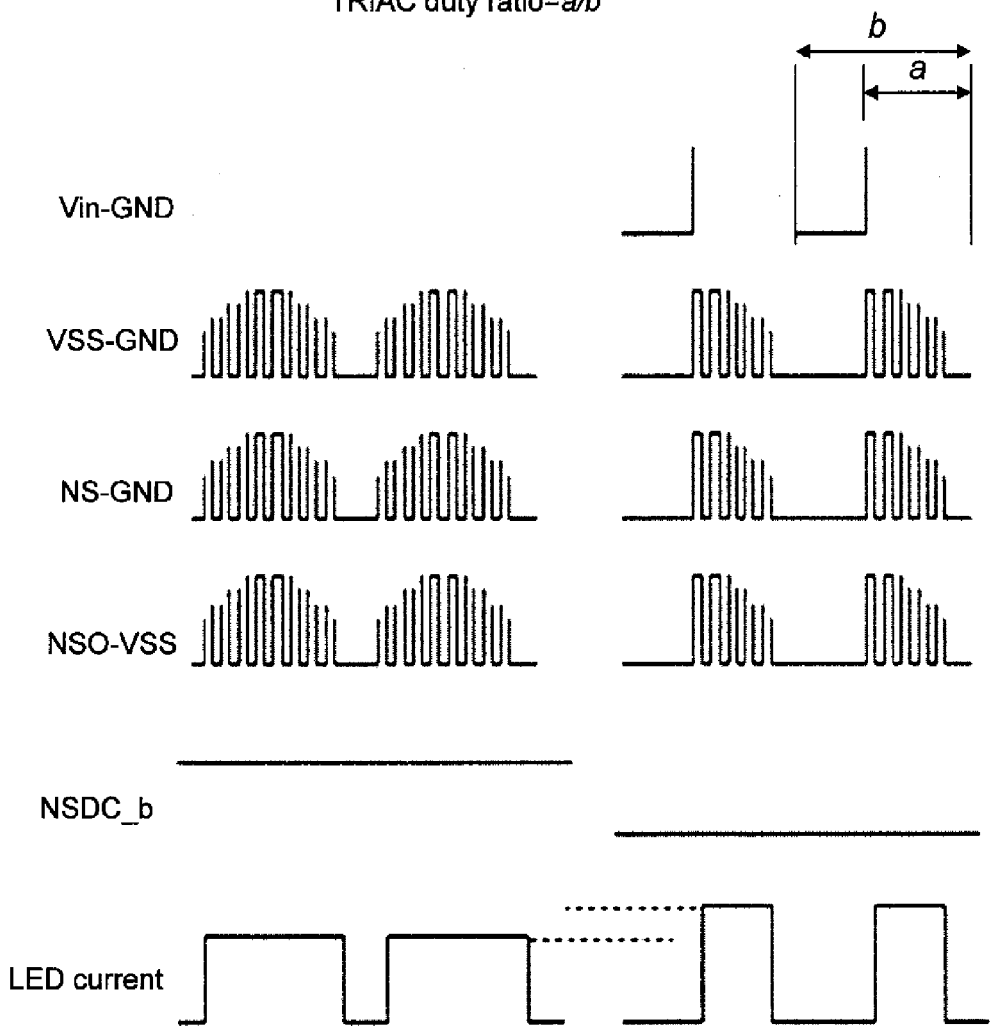

TRIAC dimming adjusts the turn-on angle of an AC signal, by which the illumination time of the LED devices in each cycle is controlled, so that the brightness of the LED devices is adjusted. However as described in the above, the adjustment of the turn-on angle is limited in a certain range, so if the relationship between the adjustment of the turn-on angle and the brightness of the LED devices can be adjusted, it will increase the flexibility in many applications. FIGS. 11A-11D illustrate that the present invention can be applied to adjusting the ratio of TRIAC dimming (that is, adjusting the relationship between the change of the turn-on angle and the brightness of the LED devices). As shown in FIG. 11A, the purpose of such adjustment for example is to prevent the LED devices from being too dark when the TRIAC signal drops to a lower duty ratio (=a/b). That is, when the TRIAC signal has a lower duty ratio, although the illumination time of the LED devices is shortened, the LED current is increased so that the brightness of the LED devices does not drop too low, as shown by the lowest waveform in FIG. 11B.

Figure 11C:
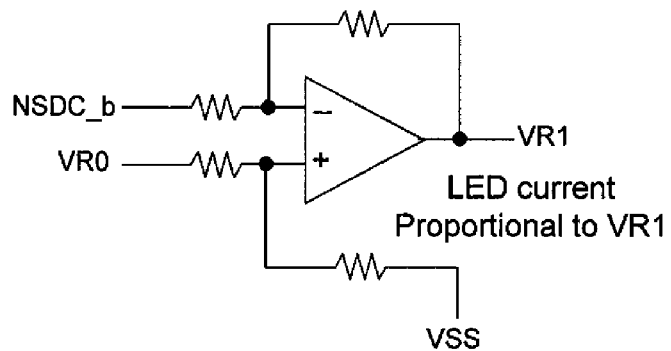
Figure 11D:
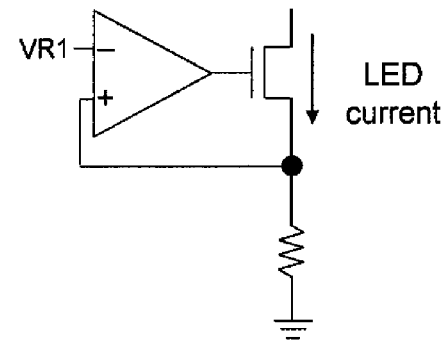

Embodiments of circuits to achieve the above purpose are shown in FIGS. 11C-11D, wherein the LED current for example can be controlled by a current source circuit as shown in FIG. 11D such that the LED current is proportional to the reference voltage VR1, and the circuit shown in FIG. 11C can adjust the reference voltage VR1 in correspondence to the waveform NSDC_b, such that when the level of the waveform NSDC_b decreases, the reference voltage VR1 increases. Thus, the dimming ratio of TRIAC dimming can be adjusted. In the circuit of FIG. 11C, the resistance of each resistor can be determined according to design requirement; in one embodiment they can be the same.

Application: Under Voltage Lock Out (UVLO)

When the circuit requires a certain function which should be performed according to an under voltage lock out signal, according to the present invention, because either the waveform NSDC_a or the waveform NSDC_b is an analog signal with reference to the floating ground level VSS but carrying information of an absolute level (including information of Vin-GND), the waveform NSDC_a or NSDC_b can be simply compared with the under voltage lock out reference level VUVLO by a comparator 140 to generate the under voltage lock out signal UVLO, in which the comparator 140 can be a general comparator or a hysteresis comparator.

Application: Differentiating High Line or Low Line Input

Figure 12A:
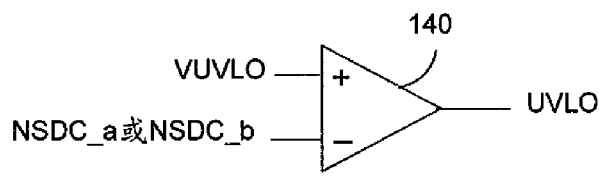
FIG. 12A illustrates an example as to how the present invention is applied to performing under voltage lock out.
Figure 12B:
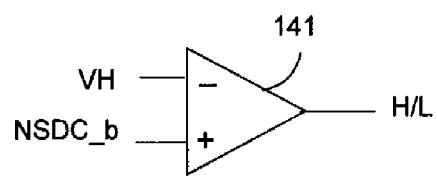
FIG. 12B illustrates an example as to how the present invention is applied to differentiating high line and low line inputs.

Depending on where the IC is applied to, the input voltage may be from a high line or a low line; for example, the input voltage may be converted from 220V or 110V AC power, and it may be required for the IC to differentiate between them (the same requirement may also exist when the input voltage is DC power). According to the present invention, as shown in FIG. 12B, a comparator 141 can be provided which compares the waveform NSDC_b with a reference level VH. When the waveform NSDC_b is higher than the reference level, it is determined that the input is a high line input; otherwise the input is a low line input. The waveform NSDC_b may be generated by the peak detector 137 or the low pass filter LPF, and the waveform NSDC_b generated by the peak detector 137 and the low pass filter LPF have different levels, so the reference level VH should be set correspondingly. If the system performs TRIAC dimming, then the dimming will affect the average value of the signal, and in this case the peak detector 137 is preferred to the low pass filter LPF. The one-stage comparison by the comparator 141 can be modified to a two-stage comparison, that is, the waveform NSDC_b can be compared with two reference levels VH1 and VH2 wherein VH1>VH2. The input is determined to be a high line input when NSDC_b>VH1; low line input when NSDC_b<VH2; and an abnormal condition is determined when VH1>NSDC_b>VH2. This can be achieved by two comparators.

Application: Power Factor Correction

A typical way for power factor correction is to input the input voltage Vin having a semi-sinusoidal waveform to a power conversion circuit, and controls the output current of the power conversion circuit such that the waveform of the output current matches the waveform of the input voltage Vin. Referring to FIGS. 13A-13D, a power factor correction circuit 30 typically includes a switch control circuit 31 and a power stage 32, wherein the power stage 32 for example can be a fly-back power conversion circuit as shown in FIG. 13C, or a buck power conversion circuit as shown in FIG. 13D. A current sense signal CS is generated by sensing the inductor (or transformer) current (in the circuit of FIG. 13C, this is done by sensing the primary side current Ip, which is related to the output current). The current sense signal CS is fed back to the switch control circuit 31, to control the power transistor P. According to the present invention, because the waveform NSDC_a reproduces the waveform of the input voltage Vin with reference to the absolute ground level GND, as shown in FIG. 13A-13B, the waveform NSDC_a can be operated with a reference signal REF to generate a reference signal REF', as the reference signal for use in the switch control circuit 31. That is, the reference signal REF' is a reference level which varies following the changes of the waveform NSDC_a, so if the power transistor P is controlled according to the comparison between the current sense signal CS and the reference signal REF', the output current can be controlled to match the waveform of the input voltage Vin. Note that the power factor correction circuit 30 should preferably include a slower feedback loop to stabilize the average value of the reference signal REF'.

Application: Boundary Conduction Control

In US patent publication US 2011/0057637 assigned to the same assignee of the present invention, a method is disclosed for controlling a switching power conversion circuit to operate in a boundary conduction mode (BCM). However, to achieve the same control function in a floating grounded IC, it requires absolute information.

In a switching power conversion circuit (FIGS. 14A-14H show the power stages of buck, boost, inverting, buck-boost power conversion circuits, and FIG. 13C shows a fly-back power conversion circuit), the inductor current is of a sawtooth waveform. FIGS. 15A-15C show the inductor current waveforms of a switching power conversion circuit operating in continuous conduction mode (CCM), boundary conduction mode (BCM), and discontinuous conduction mode (DCM), respectively. In CCM, the valley of the inductor current is higher than zero; in BCM, after the valley of the inductor current reaches zero, the inductor current immediately increases; in DCM, the valley of the inductor current is higher than zero stays at zero for a while, and there is ringing as shown in the figure. In general high voltage applications, if the switching power conversion circuit can be controlled to operate in BCM, the power conversion efficiency will be the best. To control the power conversion circuit such that it operates in BCM, one method is to detect whether there is ringing as shown in FIG. 15C. If yes, it means that the power conversion circuit is operating in DCM, and if the frequency of the power transistor is increased, or the on-time or off-time of the power transistor is reduced, the operation mode of the power conversion circuit will move toward BCM from CCM. However, the ringing is a phenomenon with reference to the absolute ground level. In a floating grounded IC, such ringing needs to be reproduced with reference to the floating ground level VSS, so that detection of such ringing is possible.

Figure 14A:
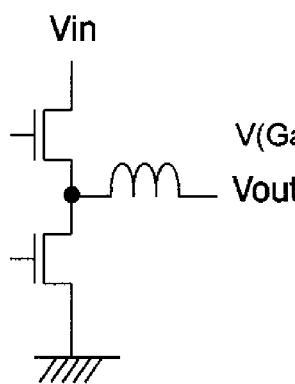
FIGS. 14A-14H show examples of power stages of several power conversion circuits.
Figure 14B:
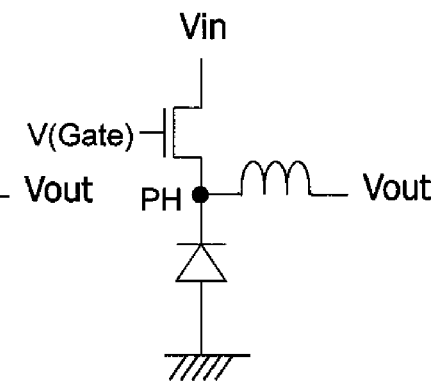
Figure 14C:
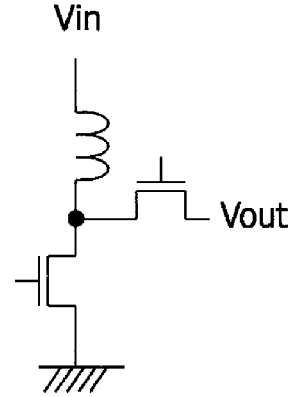
Figure 14D:
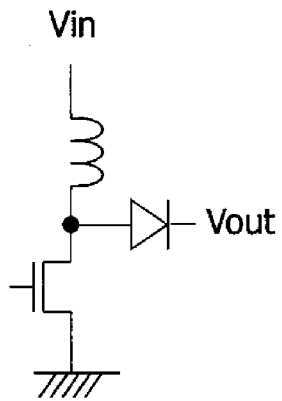
Figure 14E:
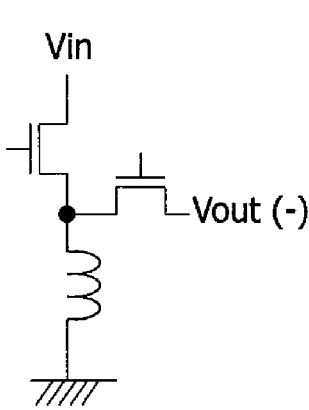
Figure 14F:
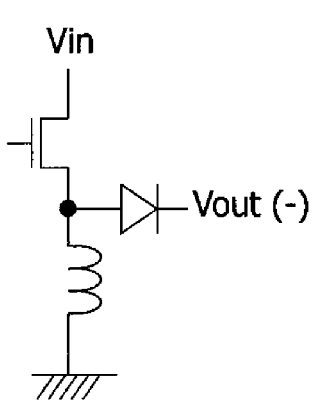
Figure 14G:
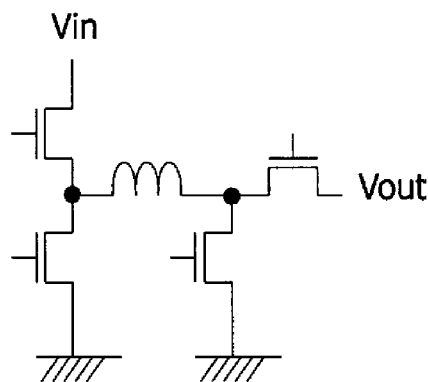
Figure 14H:
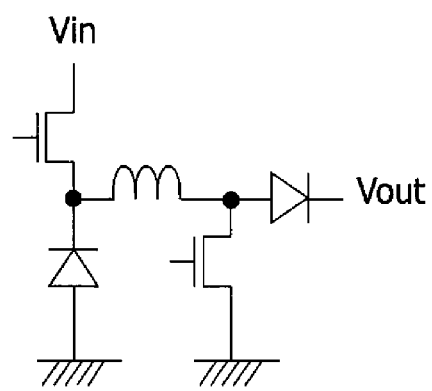
Figure 16C:
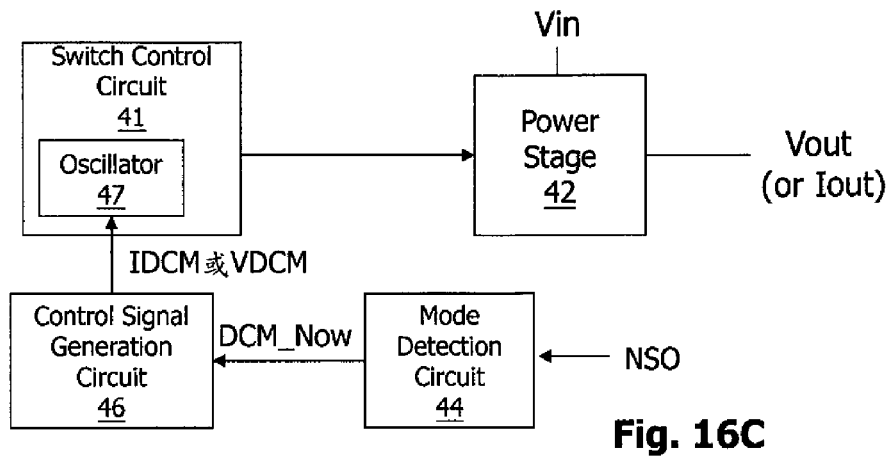

Referring to FIGS. 16A-16B, according to the present invention, the circuit of FIG. 16A can reproduce the ringing by the internal reference signal NSO. More specifically, taking the power stage shown in FIG. 14B as an example and with reference to FIG. 16B, when the power transistor in FIG. 14B is on (the gate voltage V(Gate) at high level), the floating ground level VSS is connected to the node PH, so it is at high level with reference to the absolute ground level GND, and the inductor current increases. When the power transistor is off (the gate voltage V(Gate) at low level), the floating ground level VSS is at low level with reference to the absolute ground level GND, and the inductor current decreases. But if the power transistor is off for too long, the ringing occurs in the inductor current, and because the floating ground level VSS is connected to the node PH, such ringing also occurs in the floating ground level VSS. The ringing is reflected in the current Is, and because the internal reference signal NSO is the floating ground level VSS plus a voltage cross the resistor 133, and the voltage cross the resistor 133 is equal to the current Is multiplied by the resistance of the resistor 133, the internal reference signal NSO will reproduce the ringing with reference to the floating ground level VSS. As shown in FIG. 16B, by setting a proper reference level VB, such ringing can be detected.

Figure 16D:
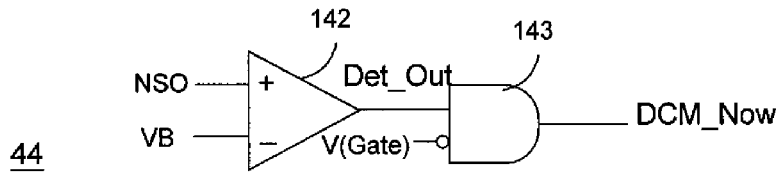
Figure 16F:
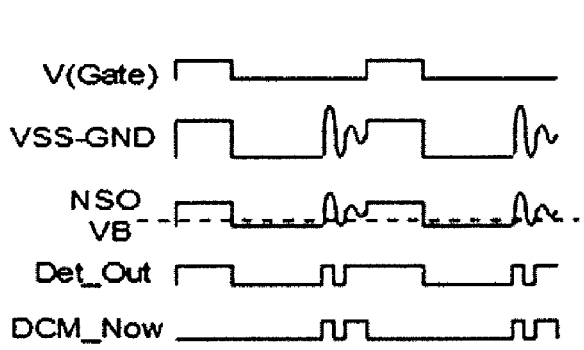
Figure 16E:
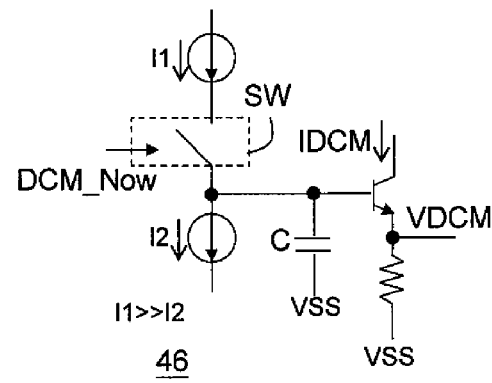

Embodiments to detect the ringing and to achieve BCM control are shown in FIGS. 16C-16F. A switching power conversion circuit typically includes a switch control circuit 41 for controlling the operation of the power transistor in the power stage 42, and the switch control circuit 41 operates according to a clock signal. According to the present invention, a mode detection circuit 44 is provided to detect whether the power conversion circuit is operating in DCM. If yes, it generates a signal DCM_NOW. A control signal generation circuit 46 generates a current signal IDCM or a voltage signal VDCM according to the signal DCM_NOW, to adjust the frequency of an oscillator 47 (the oscillator 47 is a current-controlled or voltage-controlled oscillator). In this way, the clock frequency in the switch control circuit 41 is adjusted and the operation of the power conversion circuit is moved toward BCM. An embodiment of the mode detection circuit 44 is shown in FIG. 16D, also referring to FIG. 16F, a comparator 142 compares the internal reference signal NSO with a reference level VB, and generates a signal Det_Out. A logic gate 143 receives this signal Det_Out and the gate voltage V(Gate) of the power transistor, so that only when the power transistor is off, the signal Det_Out passes through the logic gate 143 to generate the signal DCM_NOW. An embodiment of the control signal generation circuit 46 is shown in FIG. 16E, in which the current of the upper current source should preferably be larger than the current of the lower current source. When the signal DCM_NOW turns on the switch SW, the capacitor C is charged, so the current signal IDCM and the voltage signal VDCM rise. When the signal DCM_NOW turns off the switch SW, the capacitor C slowly discharges, so the current signal IDCM and the voltage signal VDCM drop slowly. The frequency of the oscillator 47 is controlled by the current signal IDCM or the voltage signal VDCM.

Based on the ringing waveform reproduced by the present invention, there are various methods to control the power conversion circuit so that it operates in BCM; please refer to US 2011/0057637 assigned to the same assignee of the present invention. The details thereof are not redundantly repeated here.

Application: LED Dimming Control by AC Power Switch

In US patent publication US 2010/0308749 assigned to the same assignee of the present invention, a method is disclosed for controlling LED brightness (i.e., LED dimming control) by an AC power switch. A user controls an AC switch, and a level adjustment signal is generated in correspondence to the switching times of the AC switch, to adjust the brightness of the LED devices.

Figure 17A:
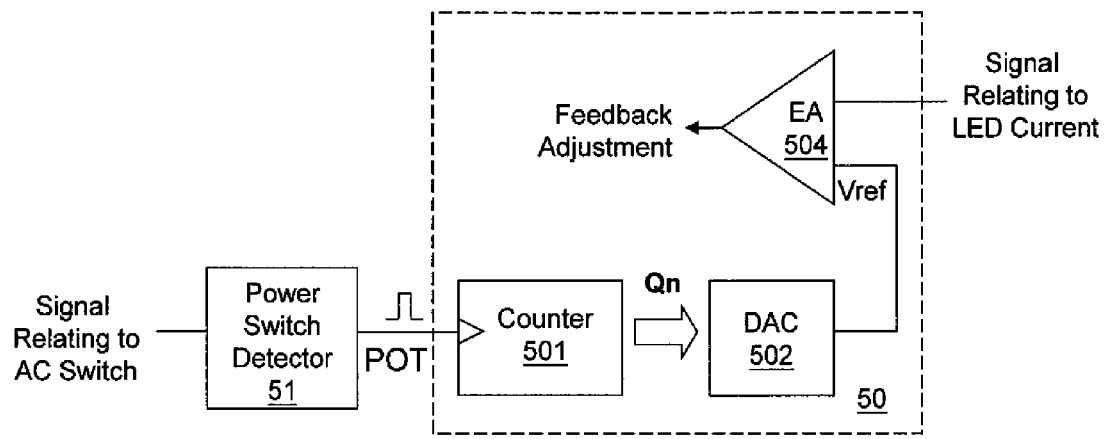
FIGS. 17A-17C illustrate an example as to how the present invention is applied to controlling LED brightness by an AC switch.

Referring to FIG. 17A, which explains how to adjust the LED brightness by the switching times of the AC switch. A power switch detector 51 detects the on and off of the AC switch and generates a signal POT, wherein the signal POT generates a pulse every time when the AC switch is turned on. An LED brightness adjustment circuit 50 includes a counter 501, a digital to analog converter (DAC) 502 and an error amplifier 504. The counter 501 counts the number of pulses in the signal POT. The count Qn for example can be converted to an analog signal by the DAC 502, so that it can be used as a reference signal Vref. The error amplifier 504 compares a signal relating to LED current with the reference signal Vref. By feedback control mechanism, the signal relating to LED current is balanced at a level equal to the level of the reference signal Vref; in other words, the LED current (i.e., the LED brightness) is controlled at a desired level. The DAC 502 can be any circuit that is capable of converting a digital signal to an analog signal; when different count numbers Qn are converted to different analog reference signals, the ratio or relationship among the count numbers are not required to be retained in the converted analog signals.

Figure 17B:
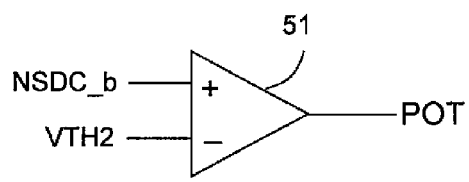
Figure 17C:
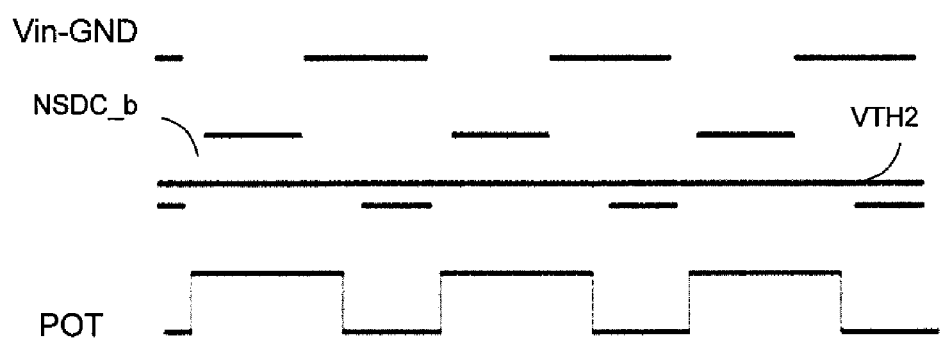

The on and off of an AC switch is absolution information with reference to the absolute ground level. If the aforementioned LED dimming control by AC switch is to be attained, the circuit needs to be capable of detecting the on and off of the AC switch according to a signal with reference to the floating ground level. According to the present invention, the power switch detector 51 for example can be embodied as a circuit shown in FIG. 17B. The power switch detector 51 is a comparator comparing the waveform NSDC_b with a reference level VTH2. Referring to FIG. 17C, when the waveform NSDC_b is higher than the reference level VTH2, it means that input voltage Vin is supplied to the system, that is, the AC switch is on. Otherwise, the AC switch is off. Thus, the power switch detector 51 can detect the switching of the AC switch.

For other details of adjusting the LED brightness according to the switching of the AC switch, please refer to US 2010/0308749 assigned to the same assignee of the present invention.

Figure 18:
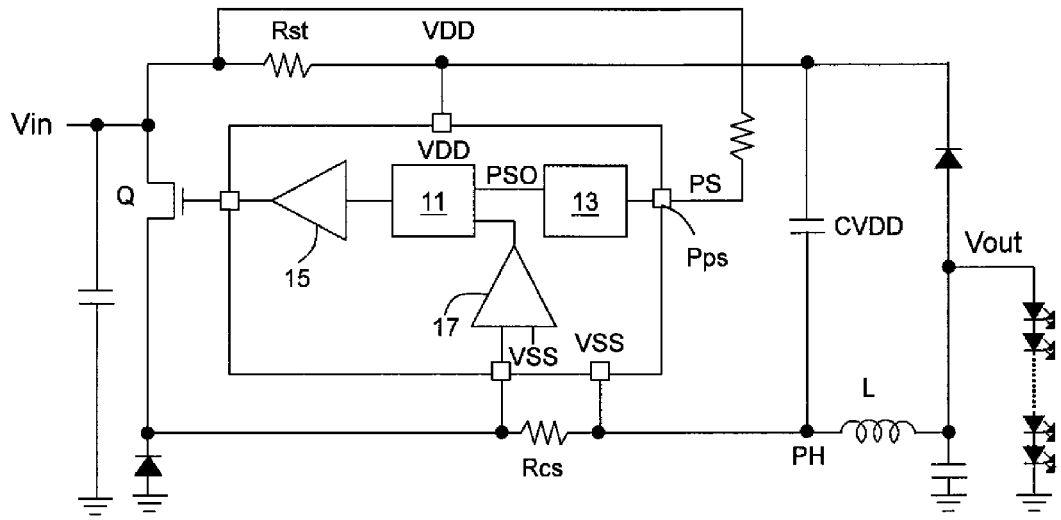
FIGS. 18-19 show two other embodiments of the present invention.
Figure 19:
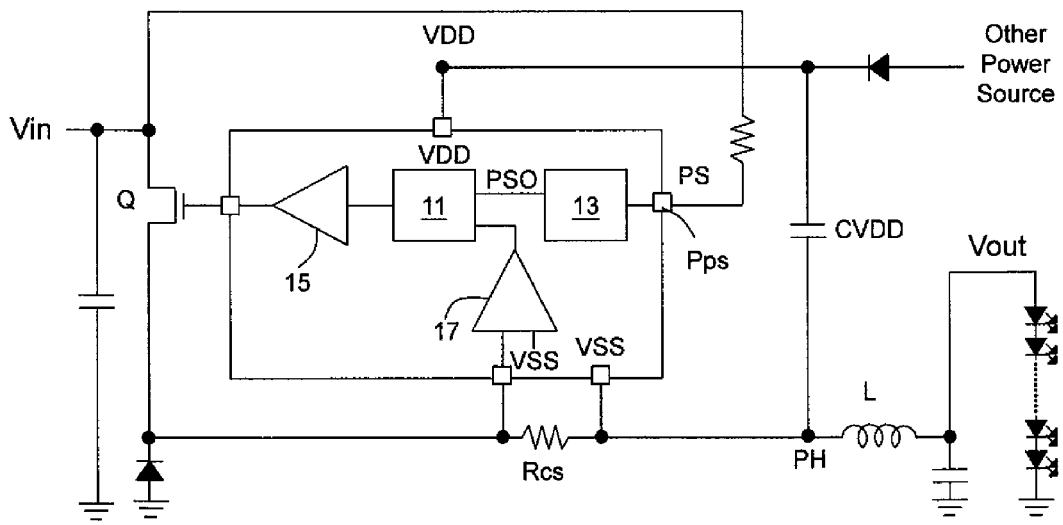

In all of the foregoing embodiments, the absolute information sense signal NS is a signal with reference to the absolute ground level, and the absolute information carried by the absolute information sense signal NS is the absolute ground level. However, to achieve the objectives of the present invention and provide the same function, it is not necessary for the absolute signal to be a signal with reference to the absolute ground level and carrying information about the absolute ground level; a signal with reference to the input voltage Vin also can provide the absolute information. FIGS. 18-19 show embodiments corresponding to the embodiments of FIGS. 3 and 6, but the absolute information sense signal PS is a signal with reference to the input voltage Vin, obtained by the IC through the absolute signal sense pin Pps.

In the embodiments of FIGS. 18-19, the absolute signal sense circuit 13 for example can be embodied as shown in FIG. 20A. In this embodiment, the absolute signal sense circuit 13 includes a transistor 151 and an internal reference signal generation circuit 152, wherein the internal reference signal generation circuit 152 provides a control voltage 151 to control the transistor 151 such that a current Is is generated. The internal reference signal generation circuit 152 converts this current Is to an internal reference signal PSO; the internal reference signal PSO can have a value equal to this current Is, or can be a voltage or current signal converted from this current Is.

One preferred embodiment of the transistor 151 is shown in FIG. 20B. As shown in the figure, the transistor 151 is a PMOSFET including an N type body 15N formed by an N-well encompassed by a P type substrate or a P-well 15P; a P type heavily doped drain 15D and a P type heavily doped source 15S located in the N type body 15N; an N type heavily doped body electrode 15B; and a gate 15G above the substrate.

There are various ways for the internal reference signal generation circuit 152 to convert the current Is to the internal reference signal PSO such that the internal reference signal PSO is related to the absolute information carried by the absolute information sense signal PS. Several examples are shown in FIGS. 20C-20F, wherein the internal reference signal PSO in FIGS. 20C and 20E are current signals and the internal reference signal PSO in the other figures are voltage signals. In each of these embodiments, the absolute information carried by the absolute information sense signal PS is the information about the input voltage Vin, and the absolute information sense signal PS is a current proportional to the voltage difference between the input voltage Vin and the high operation level VDD. In FIGS. 20C-20D, the current at the left of the circuit flows from the high operation level VDD downward, and the current Is at the right flows from the level of the source of the transistor 151 (which is coupled to the input voltage Vin through a resistor, as shown in FIGS. 18-19). Thus, the current Is is related to the relationship between the input voltage Vin and the high operation level VDD; in other words, the internal reference signal PSO is related to the information carried by the absolute information sense signal PS (information about the input voltage Vin). In FIGS. 20E-20F, the control end of the transistor 151 (the gate of a FET or the base of a BJT) receives the high operation level VDD, and generates the current Is according to the relationship between the high operation level VDD and the input voltage Vin.

Figure 21A:
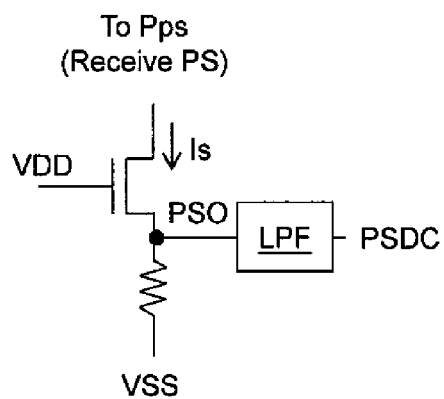
FIG. 21A-21C illustrate that the internal reference signal PSO is also capable of reproducing a waveform of an input voltage with reference to an absolute ground level, and after it is filtered or after peak detection, a substantially similar waveform PSDC_a or a DC level PSDC_b can be obtained, to be used for functions which require such information.
Figure 21B:
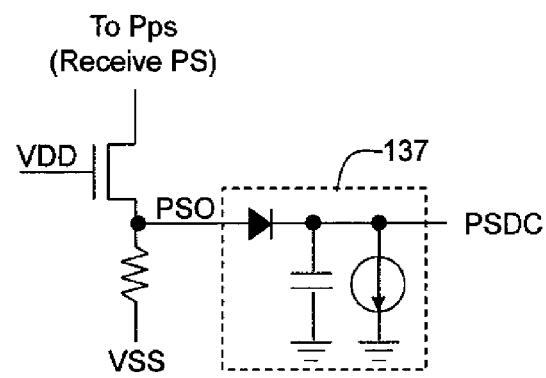
Figure 21C:
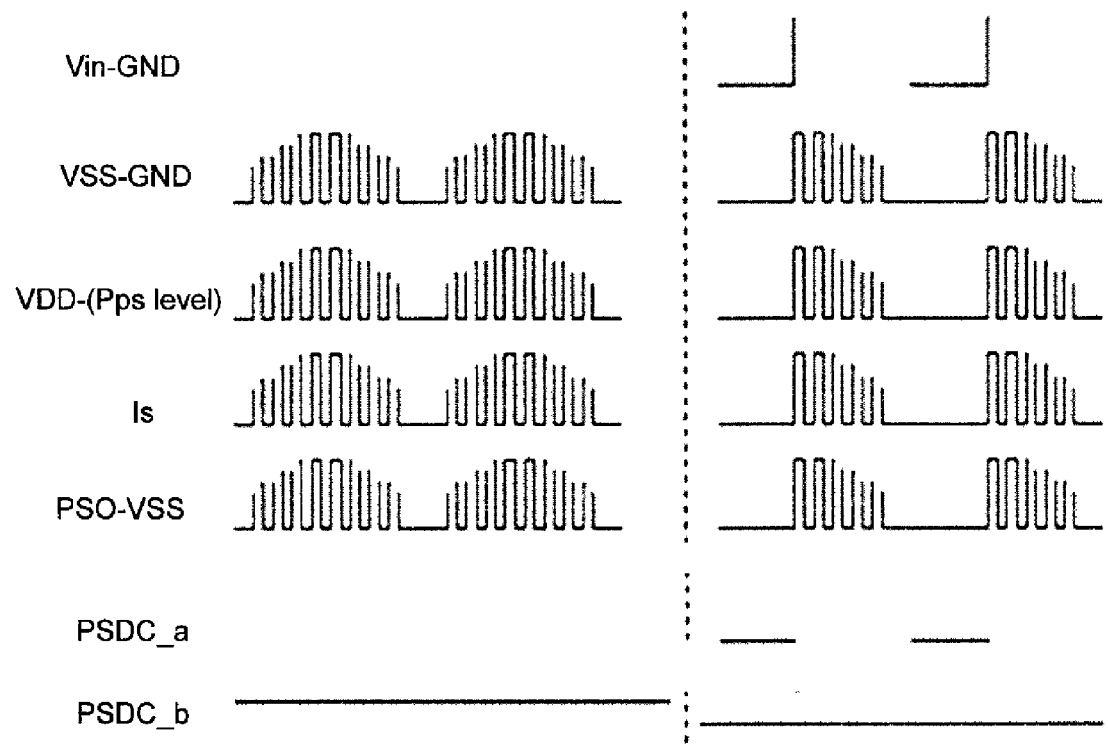

Referring to FIGS. 21A-21C, the internal reference signal PSO generated by the embodiment of FIG. 20A also reproduces the waveform of the input voltage Vin with reference to the absolute ground level GND. After the internal reference signal PSO is processed by the low pass filter LPF or the peak detector 137, a waveform PSDC_a which is substantially similar to the waveform of the input voltage Vin, or a waveform PSDC_b which is a DC level, can be obtained.

Figure 22A:
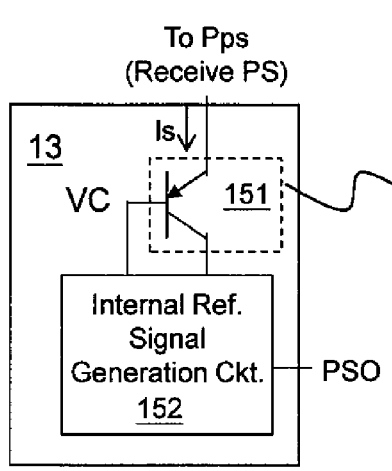
FIG. 22A shows another embodiment of the absolute signal sense circuit 13 according to the present invention.
Figure 22B:
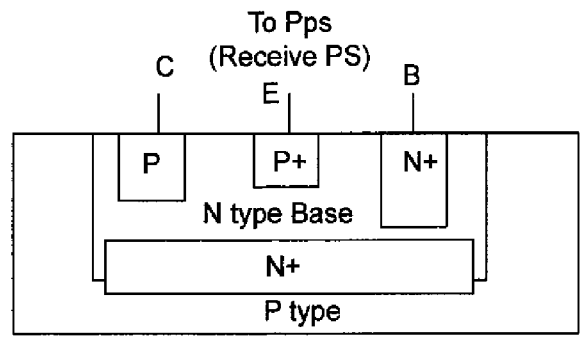
FIGS. 22B-22C show two embodiments of the transistor 151 in FIG. 22A.
Figure 22C:
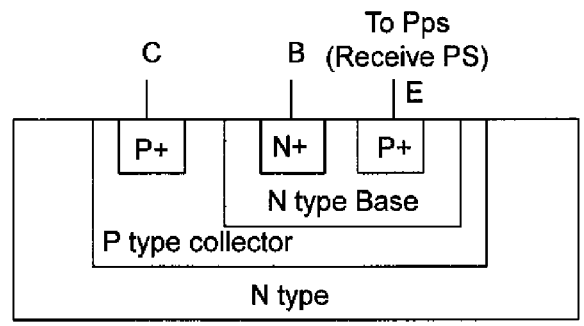

FIGS. 22A-22C show that the transistor 151 can be a BJT; embodiments of the semiconductor structure thereof are shown in FIGS. 22B-22C. FIG. 22B shows a first embodiment wherein the transistor 151 is formed in a P type substrate or a P type well formed by any suitable process; the transistor 151 includes an N type base region located below a surface of the substrate and isolated by a P type region; an N type base electrode (preferably heavily doped) located in the N type base region; a P type collector electrode located in the N type base region; and a P type emitter electrode (preferably heavily doped) in the P type base region. A heavily doped N+ region is preferably provided between the N type base region and the P type region; the heavily doped N+ region for example can be a deep well or a buried layer. FIG. 22C shows a second embodiment wherein the transistor 151 is formed in an N type substrate or a N type well formed by any suitable process; the transistor 151 includes a P type collector region located below a surface of the substrate and isolated by the N type region; a P type collector electrode located in the P type collector region; an N type base region located in the P type collector region; an N type base electrode located in the N type base region; and a P type emitter electrode located in the N type base region.

Figure 22D:
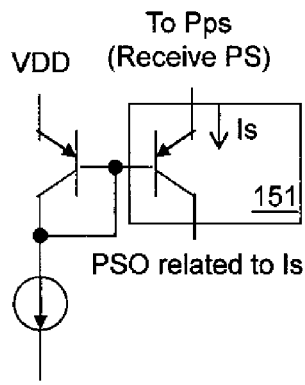
FIG. 22D-22G show several other embodiments of the absolute signal sense circuit 13 according to the present invention.
Figure 22E:
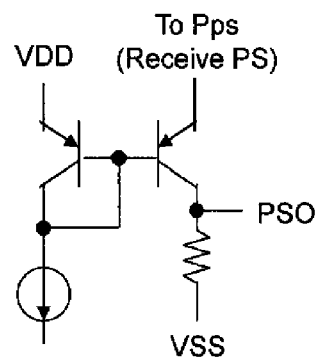
Figure 22F:
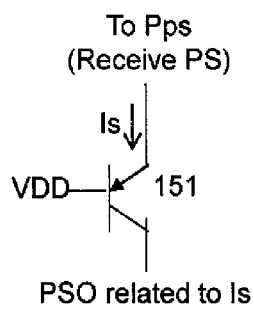
Figure 22G:
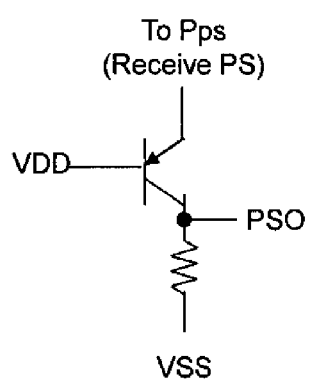

FIGS. 22D-22G show embodiments similar to the embodiments shown in FIGS. 20C-20F, wherein the internal reference signal PSO in FIGS. 22D and 22F are current signals proportional to the current Is, and the internal reference signal PSO in FIGS. 22E and 22G are voltage signals proportional to the current Is.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the positive and negative inputs to a comparator, error amplifier or operational amplifier are interchangeable, with corresponding amendments to the circuits handing the inputs and output of the comparator, error amplifier or operational amplifier. For another example, a device or circuit which does not substantially influence the primary function of a signal can be inserted between any two devices in the shown embodiments, such as, a device or circuit can be inserted between the absolute signal sense circuit 13 and the absolute signal sense pin Pns or Pps, or between the absolute signal sense circuit 13 and the switch control circuit 11. For yet another example, the comparators in the embodiments can be replaced by a Smith trigger; in a Smith trigger, if the level switching point between the high and low levels properly set, it is equivalent to setting a reference level in a comparator. In other words, the Smith trigger also provides a function for comparing an input signal with the level switching point, so the Smith trigger should be deemed as one embodiment of the comparator. In view of the foregoing, the spirit of the present invention should cover all such and other modifications and variations, which should be interpreted to fall within the scope of the following claims and their equivalents.

What is claimed is:

1. A method for providing absolute information for a floating grounded integrated circuit (IC), the IC operating between a high operation level and a floating ground level, the method comprising:
receiving an absolute information sense signal carrying absolute information;
converting the absolute information sense signal to a current signal; and
generating an internal reference signal according to the current signal converted from the absolute information sense signal, wherein the internal reference signal or a relationship between the internal reference signal and the floating ground level is related to the absolute information.

2. The method as claimed in claim 1, wherein the internal reference signal has a value equal to or proportional to the current signal.

3. The method as claimed in claim 1, wherein the step of generating an internal reference signal includes: converting the current signal to a voltage proportional to the current signal; and adding the voltage to the floating ground level to generate the internal reference signal.

4. The method as claimed in claim 1, further comprising: coupling the internal reference signal to a low pass filter or a peak detector, to generate a direct current (DC) signal according to the internal reference signal.

5. The method as claimed in claim 1, wherein the step of converting the absolute information sense signal to a current signal is achieved by a transistor having a control end, a current inflow end and a current outflow end, the control end receiving the high operation level or the floating ground level, one of the current inflow end and the current outflow end receiving the absolute information sense signal, so as to generate the current signal at the current inflow end.

6. The method as claimed in claim 1, wherein the step of converting the absolute information sense signal to a current signal is achieved by a transistor formed in a substrate, the transistor including:
a body of a first conductivity type, located below a surface of the substrate;
a gate located above the substrate, for receiving a gate voltage;
a source and a drain of a second conductivity type, located in the body and at two sides of the gate;
a body electrode of a first conductivity type, located in the body and coupled to the source, for receiving the absolute information sense signal together with the source.

7. The method as claimed in claim 6, wherein the transistor further comprises an isolation region of a second conductivity type encompassing the body, the isolation region being coupled to a first voltage; the body and the isolation region having a junction forward bias voltage; and the gate voltage being smaller than a sum of the first voltage, a threshold voltage of the transistor, and the junction forward bias voltage.

8. The method as claimed in claim 1, wherein the step of converting the absolute information sense signal to a current signal is achieved by a transistor formed in a substrate, the transistor including:
an isolated collector region of a first conductivity type, located below a surface of the substrate;
a collector electrode of a first conductivity type, located in the isolated collector region;
a base region of a second conductivity type, located in the isolated collector region;
a base electrode of a second conductivity type, located in the base region; and
an emitter electrode of a first conductivity type, located in the base region.

9. The method as claimed in claim 1, wherein the step of converting the absolute information sense signal to a current signal is achieved by a transistor formed in a substrate, the transistor including:
an isolated base region of a first conductivity type, located below a surface of the substrate;
a base electrode of a first conductivity type, located in the base region;
a collector electrode of a second conductivity type, located in the base region; and
an emitter electrode of a second conductivity type, located in the base region.

10. The method as claimed in claim 9, wherein the transistor further comprises a high concentration doped region of a first conductivity type below the base region.

11. The method as claimed in claim 1, wherein the absolute information sense signal is a pulse width modulation (PWM) signal or an analog signal generated by a dimming circuit according to a dimming signal.

12. The method as claimed in claim 1, wherein the internal reference signal is used for providing at least one of the following functions: dimming control; reproducing a waveform of an input voltage with reference to an absolute ground level; tri-electrode alternating current (TRIAC) dimming; determining timing to fire TRIAC; adjusting a dimming ratio of TRIAC dimming; under voltage lock out; differentiating high line or low line input; power factor correction; boundary conduction control; and dimming control by an alternating current (AC) power switch.

13. A circuit for providing absolute information for a floating grounded integrated circuit (IC), the IC operating between a high operation level and a floating ground level, the circuit for providing absolute information comprising:
a transistor having a current inflow end, a current outflow end and a control end, one of the current inflow end and the current outflow end receiving an absolute information sense signal carrying absolute information related to an absolute level, the control end receiving a control voltage, so as to generate a current signal at the current inflow end; and an internal reference signal generation circuit providing the control voltage to control the transistor, and generating an internal reference signal according to the current signal, wherein the internal reference signal or a relationship between the internal reference signal and the floating ground level is related to the absolute information.

14. The circuit for providing absolute information as claimed in claim 13, wherein the internal reference signal has a value equal to or proportional to the current signal.

15. The circuit for providing absolute information as claimed in claim 13, wherein the internal reference signal generation circuit converts the current signal to a voltage proportional to the current signal and adds the voltage to the floating ground level to generate the internal reference signal.

16. The circuit for providing absolute information as claimed in claim 13, wherein the control voltage is the high operation level or the floating ground level.

17. The circuit for providing absolute information as claimed in claim 13, wherein the transistor is formed in a substrate, the transistor including:
- a body of a first conductivity type, located below a surface of the substrate;
- a gate located above the substrate, for receiving a gate voltage;
- a source and a drain of a second conductivity type, located in the body and at two sides of the gate;
- a body electrode of a first conductivity type, located in the body and coupled to the source, for receiving the absolute information sense signal together with the source.

18. The circuit for providing absolute information as claimed in claim 17, wherein the transistor further comprises an isolation region of a second conductivity type encompassing the body, the isolation region being coupled to a first voltage; the body and the isolation region having a junction forward bias voltage; and the gate voltage being smaller than a sum of the first voltage, a threshold voltage of the transistor, and the junction forward bias voltage.

19. The circuit for providing absolute information as claimed in claim 13, wherein the transistor is formed in a substrate, the transistor including:
- an isolated collector region of a first conductivity type, located below a surface of the substrate;
- a collector electrode of a first conductivity type, located in the isolated collector region;
- a base region of a second conductivity type, located in the isolated collector region;
- a base electrode of a second conductivity type, located in the base region; and
- an emitter electrode of a first conductivity type, located in the base region.

20. The circuit for providing absolute information as claimed in claim 13, wherein the transistor is formed in a substrate, the transistor including:
- an isolated base region of a first conductivity type, located below a surface of the substrate;
- a base electrode of a first conductivity type, located in the base region;
- a collector electrode of a second conductivity type, located in the base region; and
- an emitter electrode of a second conductivity type, located in the base region.

21. The circuit for providing absolute information as claimed in claim 20, wherein the transistor further comprises a high concentration doped region of a first conductivity type below the base region.

22. The circuit for providing absolute information as claimed in claim 13, wherein the absolute information sense signal is generated by a dimming circuit according to a dimming signal, the dimming circuit includes at least one of the following circuits:
(1) a dimming transistor and a dimming resistor connected in series, the dimming transistor having a gate receiving the dimming signal, a first end coupled to an absolute ground level, and a second end coupled to one end of the dimming resistor; the dimming resistor having another end for providing the absolute information sense signal;
(2) a voltage controlled resistor controlled by the dimming signal to generate the absolute information sense signal at one end of the voltage controlled resistor;
(3) a voltage controlled current source controlled by the dimming signal to generate the absolute information sense signal; and
(4) a voltage controlled voltage source and a dimming resistor connected in series, the voltage controlled voltage source being controlled by the dimming signal to generate a voltage at one end of the dimming resistor, and the dimming resistor having another end for providing the absolute information sense signal.

23. The circuit for providing absolute information as claimed in claim 13, further comprising a low pass filter or a peak detector coupled to the internal reference signal generation circuit, to generate a direct current (DC) signal according to the internal reference signal.

24. The circuit for providing absolute information as claimed in claim 23, further comprising a first comparator comparing the DC signal with a first reference level to perform under voltage lock out, to differentiate high line or low line input, or to determine whether an input voltage is on.

25. The circuit for providing absolute information as claimed in claim 23, further comprising a hysteresis comparator comparing the DC signal with a second reference level to determine a timing to fire a TRIAC dimming function.

26. The circuit for providing absolute information as claimed in claim 23, further comprising an adjustment circuit for adjusting a reference voltage of a current source circuit according to the DC signal.

27. The circuit for providing absolute information as claimed in claim 23, wherein the IC includes a switch control circuit for receiving a current sense signal and comparing the current sense signal with a reference signal to control a power stage of a power conversion circuit, wherein the reference signal is determined by the DC signal.

28. The circuit for providing absolute information as claimed in claim 23, wherein the IC includes a switch control circuit for controlling a power stage of a power conversion circuit according to a clock, and wherein the circuit for providing absolute information further comprises: a mode detection circuit for determining whether the power conversion circuit is operating in a discontinuous conduction mode according to the internal reference signal; and a control signal generation circuit for generating a signal to control a frequency of the clock according to an output from the mode detection circuit.

29. The circuit for providing absolute information as claimed in claim 13, wherein the internal reference signal reproduces a waveform of an input voltage with reference to an absolute ground level, or reproduces a waveform of an inductor current.

* * * * *